United States Patent
Cho et al.

(10) Patent No.: US 12,045,470 B2
(45) Date of Patent: *Jul. 23, 2024

(54) METHOD OF WRITING DATA IN NONVOLATILE MEMORY DEVICE AND NONVOLATILE MEMORY DEVICE PERFORMING THE SAME

(71) Applicant: SAMSUNG ELECTRONICS CO., LTD., Suwon-si (KR)

(72) Inventors: Wonhee Cho, Seoul (KR); Dongeun Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/346,627

(22) Filed: Jul. 3, 2023

(65) Prior Publication Data

US 2023/0350578 A1 Nov. 2, 2023

Related U.S. Application Data

(63) Continuation of application No. 17/401,471, filed on Aug. 13, 2021, now Pat. No. 11,733,875.

(30) Foreign Application Priority Data

Nov. 25, 2020 (KR) .......................... 10-2020-0159637

(51) Int. Cl.
*G06F 3/06* (2006.01)
*G06F 12/02* (2006.01)

(52) U.S. Cl.
CPC .......... *G06F 3/0619* (2013.01); *G06F 3/0604* (2013.01); *G06F 3/064* (2013.01);
(Continued)

(58) Field of Classification Search
CPC ...... G06F 3/0604; G06F 3/061; G06F 3/0611; G06F 3/0613; G06F 3/064; G06F 3/0659;
(Continued)

(56) References Cited

U.S. PATENT DOCUMENTS 8,301,850 B2 10/2012 Kawano et al.
9,959,932 B1 * 5/2018 Zhang ................ G11C 16/3459
(Continued)

FOREIGN PATENT DOCUMENTS

KR 1020190043022 4/2019

OTHER PUBLICATIONS

Program Interference in MLC NAND Flash Memory: Characterization, Modeling, and Mitigation by Cai (Year: 2013).*
(Continued)

*Primary Examiner* — Paul M Knight
(74) *Attorney, Agent, or Firm* — F. Chau & Associates, LLC

(57) ABSTRACT

Each of a plurality of memory blocks of a nonvolatile memory device is divided into two or more wordline groups having different characteristics. A write command for at least two memory blocks among the plurality of memory blocks is received. During a first partial time interval included in an entire write time interval for two or more memory blocks, a data write operation is performed on a wordline group included in one memory block among the two or more memory blocks in response to a reception of an address for the one memory block. During a second other partial time interval included in the entire write time interval, a data write operation is performed on wordline groups included in the two or more memory blocks in response to a reception of an address for the two or more memory blocks.

20 Claims, 36 Drawing Sheets

(52) U.S. Cl.
CPC .......... *G06F 3/0659* (2013.01); *G06F 3/0679* (2013.01); *G06F 12/0246* (2013.01)

(58) Field of Classification Search
CPC .. G06F 3/0679; G06F 12/0246; G06F 3/0619; G06F 3/0638; G06F 3/0644; G06F 3/0655; G06F 3/0661; G06F 2212/72; G06F 2212/7202; G06F 2212/7203; G06F 2212/7205; G06F 2212/7211; G06F 12/0238
See application file for complete search history.

(56) References Cited

U.S. PATENT DOCUMENTS

| | | | |
|---|---|---|---|
| 10,073,622 | B2 | 9/2018 | Kim |
| 10,073,623 | B2 | 9/2018 | You |
| 10,366,760 | B1 | 7/2019 | Chen |
| 10,573,389 | B2 | 2/2020 | Kim et al. |
| 10,579,548 | B2 | 3/2020 | Richter et al. |
| 2013/0073788 | A1* | 3/2013 | Post .................... G06F 12/0246 711/E12.008 |
| 2013/0117500 | A1* | 5/2013 | Joo .................... G11C 13/0007 711/E12.008 |
| 2013/0132640 | A1* | 5/2013 | Wu .................... G06F 12/0246 711/E12.008 |
| 2014/0040535 | A1* | 2/2014 | Lee .................... G06F 12/0246 711/103 |
| 2014/0136883 | A1* | 5/2014 | Cohen ................ G11C 16/3422 714/6.11 |
| 2016/0170871 | A1* | 6/2016 | Hyun .................. G06F 3/0653 711/103 |
| 2016/0364181 | A1* | 12/2016 | McGlaughlin ........ G06F 3/0629 |
| 2017/0262176 | A1* | 9/2017 | Kanno .................. G06F 3/0613 |
| 2017/0352430 | A1* | 12/2017 | Chen .................... G11C 16/16 |
| 2019/0121580 | A1* | 4/2019 | Hong .................... G06F 3/0679 |
| 2021/0064291 | A1* | 3/2021 | Kanno ................ G06F 12/0246 |
| 2022/0066651 | A1* | 3/2022 | Miller .................. G11C 16/105 |
| 2022/0164144 | A1 | 5/2022 | Cho et al. |

OTHER PUBLICATIONS

A Low-Cost Improved Method of Raw Bit Error Rate Estimation for NAND Flash Memory of High Storage Density by Ma (Year: 2020).*
Characterizing 3D Floating Gate NAND Flash: Observations, Analyses, and Implications by Xiong (Year: 2018).*
Analysis of Edge Wordline Disturb in Multimegabit Charge Trapping Flash NAND Arrays by Zambelli (Year: 2011).*
Notice of Allowance dated Mar. 31, 2023 in corresponding U.S. Patent Appln. U.S. Appl. No. 17/401,471.
Office Action dated Dec. 15, 2022 in corresponding U.S. Appl. No. 17/401,471.
Analysis of Edge Wordline Distrub in Multimegabit Charge Trapping Flash NAND Arrays by Zambelli (Year: 2011).
Program Interference in MLC NAND Flash Memory: Characterization, Modeling, and Mitigation y Cai (Year: 2013).

* cited by examiner

FIG. 9

| ADDR | A11 | A12 | A13 | A14 | A15 | A16 | A17 | A18 | A19 | A1A | A25 | A26 | A27 | A28 | A29 | A2A |
|---|---|---|---|---|---|---|---|---|---|---|---|---|---|---|---|---|
| | | | | | | | | A21 | A22 | A23 | A24 | | | | | |
| BLK1 | MC11, MC12 | MC13, MC14 | MC15, MC16 | MC17 | MC18 | MC19 | MC1A | | | | |
| BLK2 | | | | MC21 | MC22 | MC23 | MC24 | MC25, MC26 | MC27, MC28 | MC29, MC2A |

TW1 | TW2 | TW3

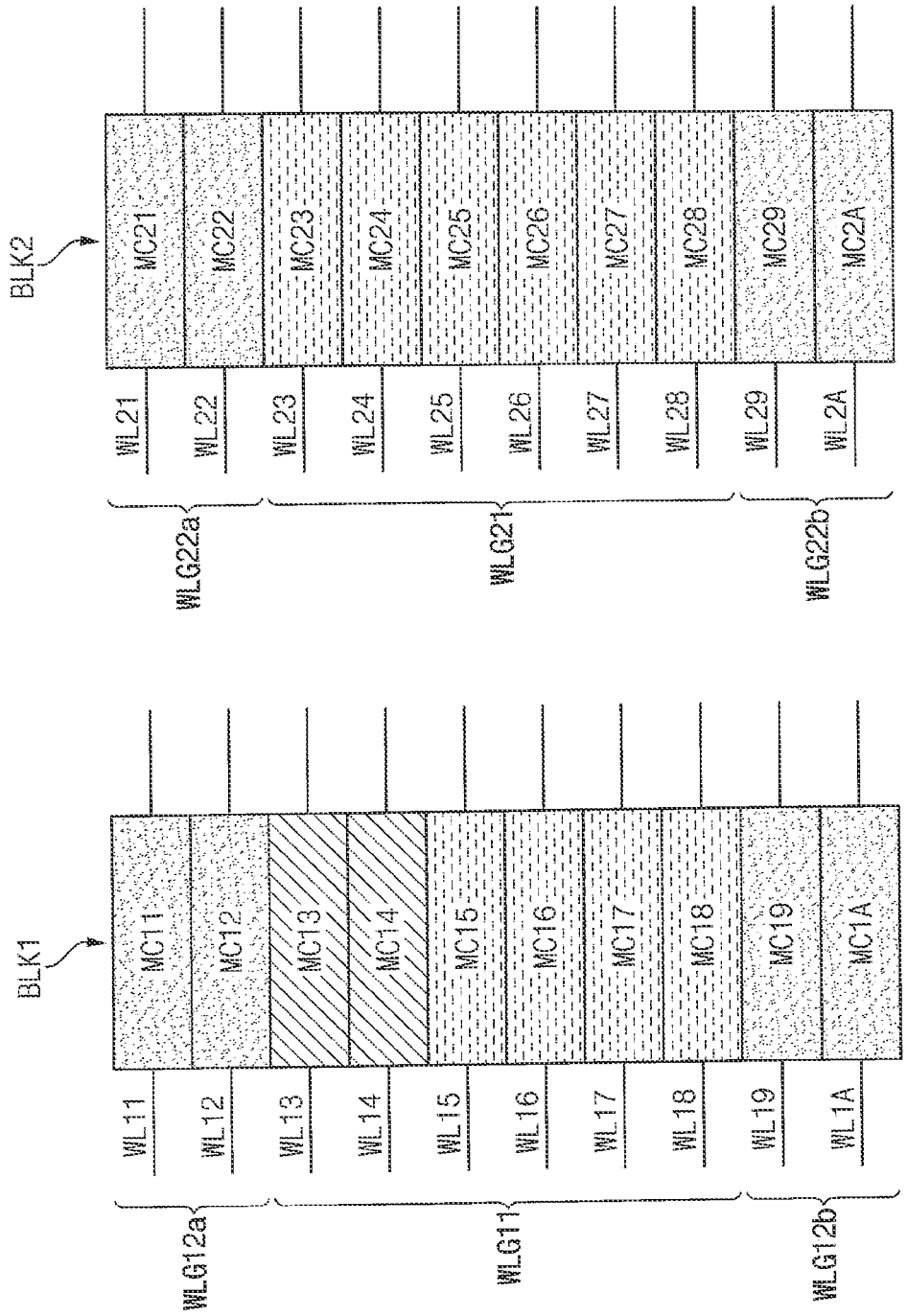

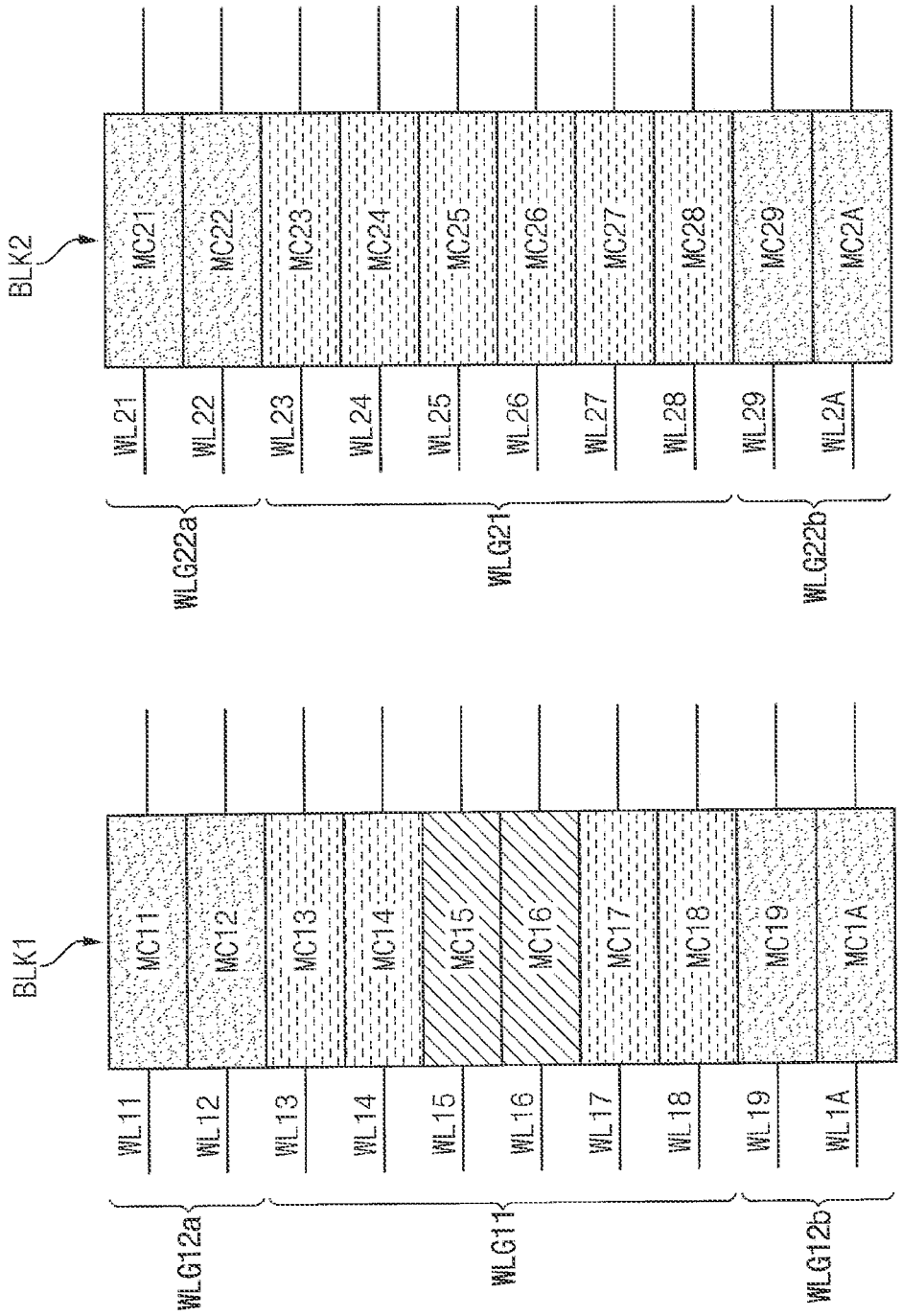
F I G. 10C

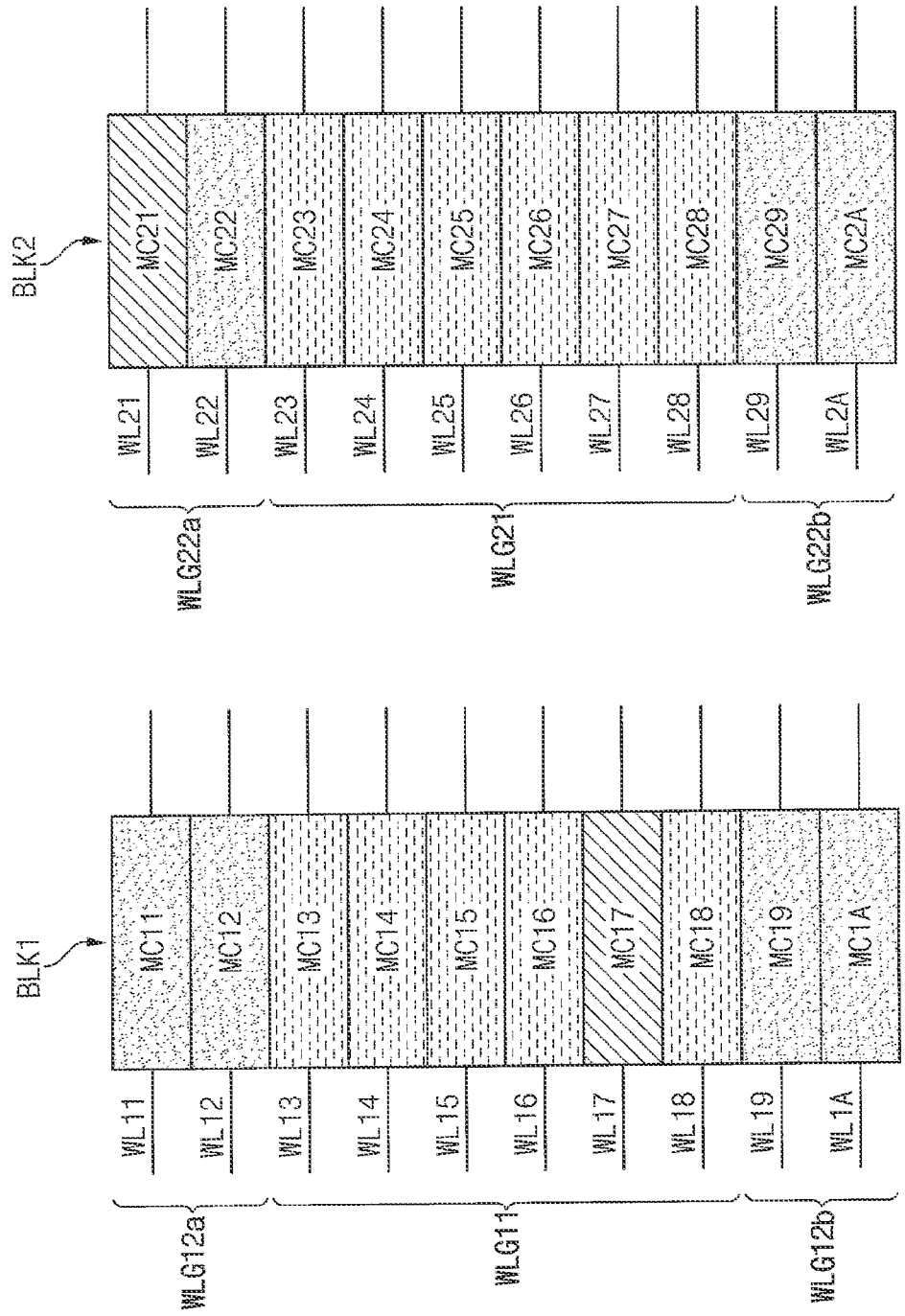

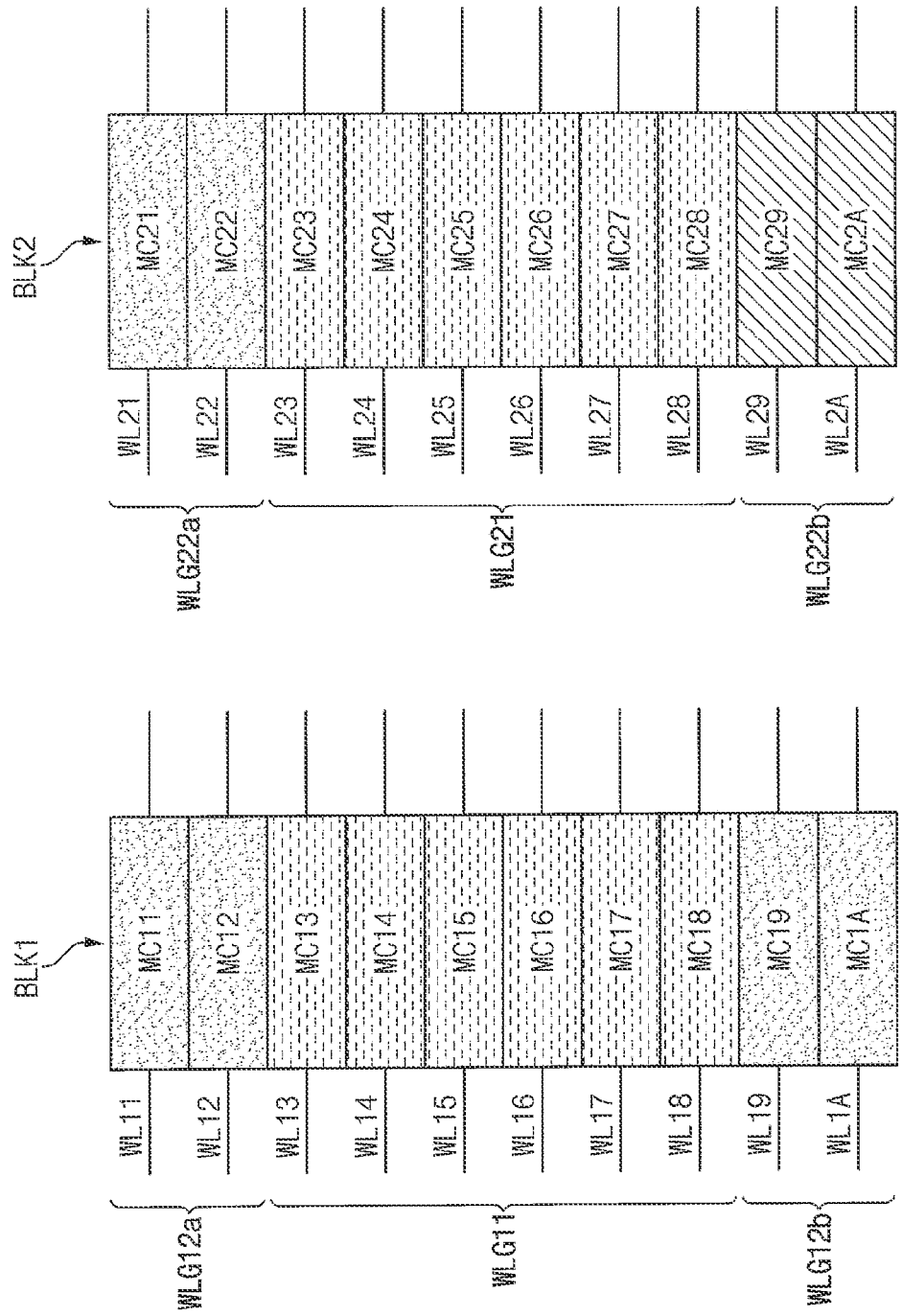

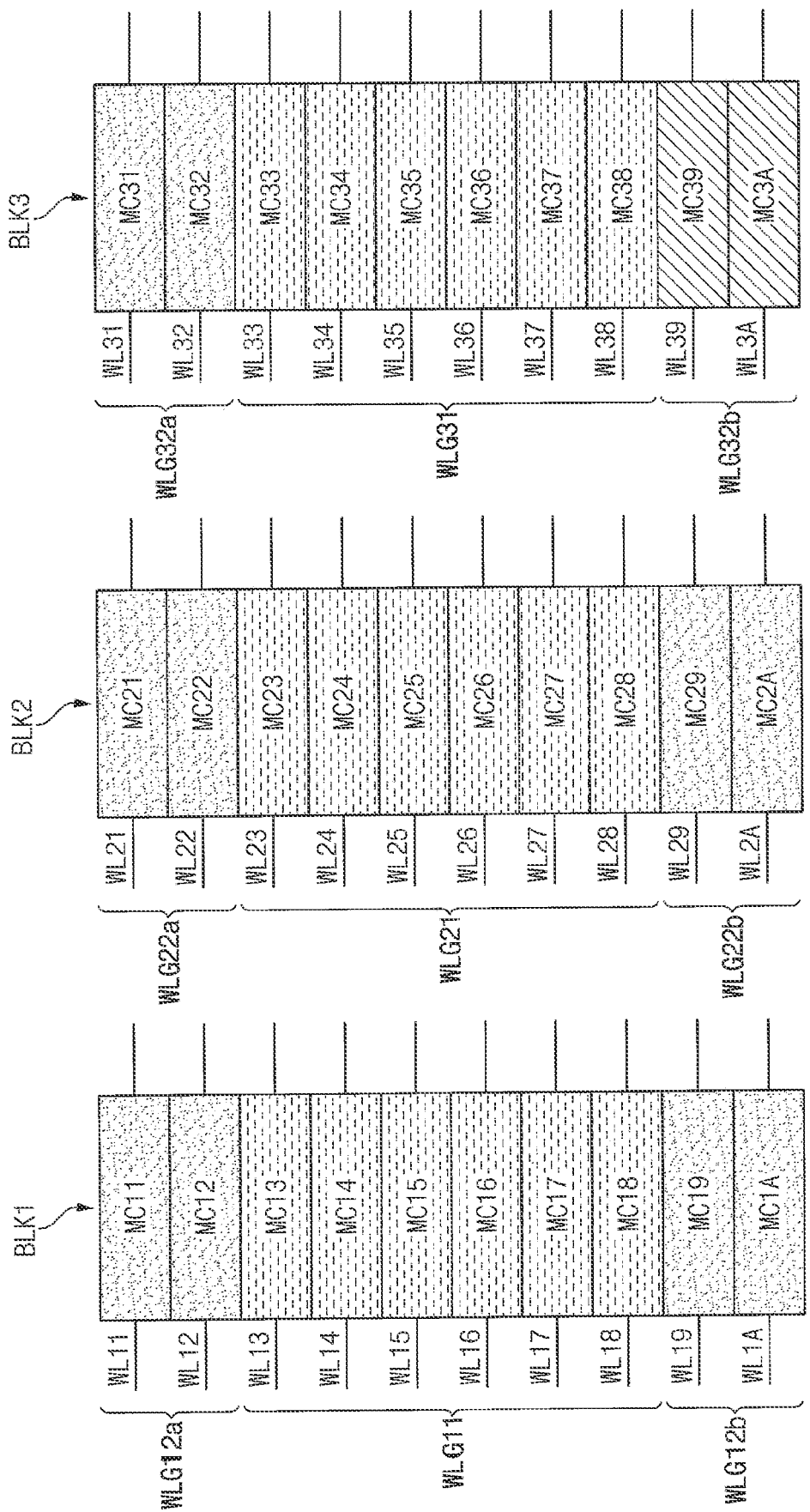

METHOD OF WRITING DATA IN NONVOLATILE MEMORY DEVICE AND NONVOLATILE MEMORY DEVICE PERFORMING THE SAME

CROSS-REFERENCE TO RELATED APPLICATION

This U.S. non-provisional patent application is a continuation of U.S. patent application Ser. No. 17/401,471 filed Aug. 13, 2021, which claims priority under 35 USC § 119 to Korean Patent Application No. 10-2020-0159637 filed on Nov. 25, 2020 in the Korean Intellectual Property Office (KIPO), the disclosures of which are incorporated by reference in their entirety herein.

TECHNICAL FIELD

Example embodiments relate generally to semiconductor memory, and more particularly to methods of writing data in nonvolatile memory devices, and nonvolatile memory devices performing the methods of writing data.

DISCUSSION OF RELATED ART

Semiconductor memory is a digital electronic semiconductor device used for digital data storage. Semiconductor memory can generally be divided into two categories depending upon whether or not they retain stored data when disconnected from a power supply. These categories include volatile memory devices, which lose stored data when disconnected from power, and nonvolatile memory devices, which retain stored data when disconnected from power. While volatile memory devices may perform read and write operations at a high speed, contents stored therein may be lost during a power-off. Since nonvolatile memory devices retain contents stored therein even at power-off, they may be used to store data that needs to be retained permanently.

As the degree of integration of a nonvolatile memory device increases, the size of one memory block included in the nonvolatile memory device increases. An input/output (I/O) efficiency of some wordlines of the memory block may decrease as the blocks size increases. Thus, a performance variation may occur while a data write operation is performed on a plurality of memory blocks.

SUMMARY

At least one example embodiment of the present disclosure provides a method of writing data in a nonvolatile memory device capable of efficiently performing a data write operation.

At least one example embodiment of the present disclosure provides a nonvolatile memory device that performs the method of writing data.

According to an example embodiment of the inventive concept, a method of writing data in a nonvolatile memory device including a plurality of memory blocks is provided. In the method, each of the plurality of memory blocks is divided into two or more wordline groups having different characteristics. A write command for at least two memory blocks among the plurality of memory blocks is received. During a first partial time interval included in an entire write time interval for the two or more memory blocks, a data write operation is performed on a wordline group included in one memory block among the two or more memory blocks in response to a reception of an address for the one memory block. During a second other partial time interval included in the entire write time interval, a data write operation is performed on wordline groups included in the two or more memory blocks in response to a reception of an address for the two or more memory blocks.

According to an exemplary embodiment of the inventive concept, a nonvolatile memory device includes a memory cell array and a control circuit. The memory cell array includes a plurality of memory blocks. The control circuit divides each of the plurality of memory blocks into two or more wordline groups having different characteristics, receives a write command for at least two memory blocks among the plurality of memory blocks, performs a data write operation on a wordline group included in one memory block among the two or more memory blocks in response to a reception of an address for the one memory block during a first partial time interval included in an entire write time interval for the two or more memory blocks, and performs a data write operation on wordline groups included in the two or more memory blocks in response to a reception of an address for the two or more memory blocks during a second other partial time interval included in the entire write time interval.

According to an example embodiment of the inventive concept, a method of writing data in a nonvolatile memory device that includes a plurality of memory blocks is provided. In the method, a first memory block among the plurality of memory blocks is divided into a first wordline group having a first characteristic and a second wordline group having a second characteristic. A second memory block among the plurality of memory blocks is divided into a third wordline group having the first characteristic and a fourth wordline group having the second characteristic. During a first write time interval included in an entire write time interval for the first and second memory blocks, a data write operation is performed on first selected wordlines included in the first wordline group in response to a reception of a first address for the first selected wordlines. During a second write time interval included in the entire write time interval subsequent to the first write time interval, a data write operation is performed on second selected wordlines included in the first wordline group and third selected wordlines included in the fourth wordline group in response to a reception of a second address for the second selected wordlines and a third address for third selected wordlines. During the second write time interval, a data write operation is performed on fourth selected wordlines included in the second wordline group and fifth selected wordlines included in the third wordline group in response to a reception of a fourth address for the fourth selected wordlines and a fifth address for the fifth selected wordlines. During a third write time interval included in the entire write time interval subsequent to the second write time interval, a data write operation is performed on sixth selected wordlines included in the third wordline group in response to a reception of a sixth address for the sixth selected wordlines.

According to an exemplary embodiment of the inventive concept, a nonvolatile memory device includes a memory cell array and a control circuit. The memory cell array includes first and second memory blocks. The first memory block includes a first region having a first characteristic and a second region having a second other characteristic. The second memory block includes a first region having the first characteristic and a second region having the second characteristic. The control circuit is configured to: write data to the first and second regions of the first memory block, during a first period of a write time interval for writing both the first and second memory blocks; write data to the first region of the first memory block and the second region of the second memory block, during a second period of the write time interval; and write data to the first and second regions of the second memory block, during a third period of the write time interval.

In at least one embodiment, in a method of writing data in the nonvolatile memory device and the nonvolatile memory device, each memory block is divided into the two or more wordline groups depending on their characteristics, and then a data write operation is performed by simultaneously operating on the two or more memory blocks. In addition, the data write operation may be performed by mixing the wordline groups included in the different memory blocks and having the different characteristics only during a partial time interval. Accordingly, performance variation or fluctuation that occurs depending on the wordline characteristics may be reduced or mitigated, performance bottleneck may be reduced or eliminated, and deterioration of quality of service (QoS) may be prevented.

BRIEF DESCRIPTION OF THE DRAWINGS

Illustrative, non-limiting example embodiments of the inventive concept will be more clearly understood from the following detailed description taken in conjunction with the accompanying drawings.

FIGS. 9, 10A, 10B, 10C, 10D, 10E, 10F, 10G, 10H, 10I and 10J are diagrams for describing an operation of FIG. 8.

FIGS. 14, 15A, 15B, 15C, 15D, 15E, 15F and 15G are diagrams for describing an operation of FIG. 13.

DETAILED DESCRIPTION OF THE EXAMPLE EMBODIMENTS

Figure 1:
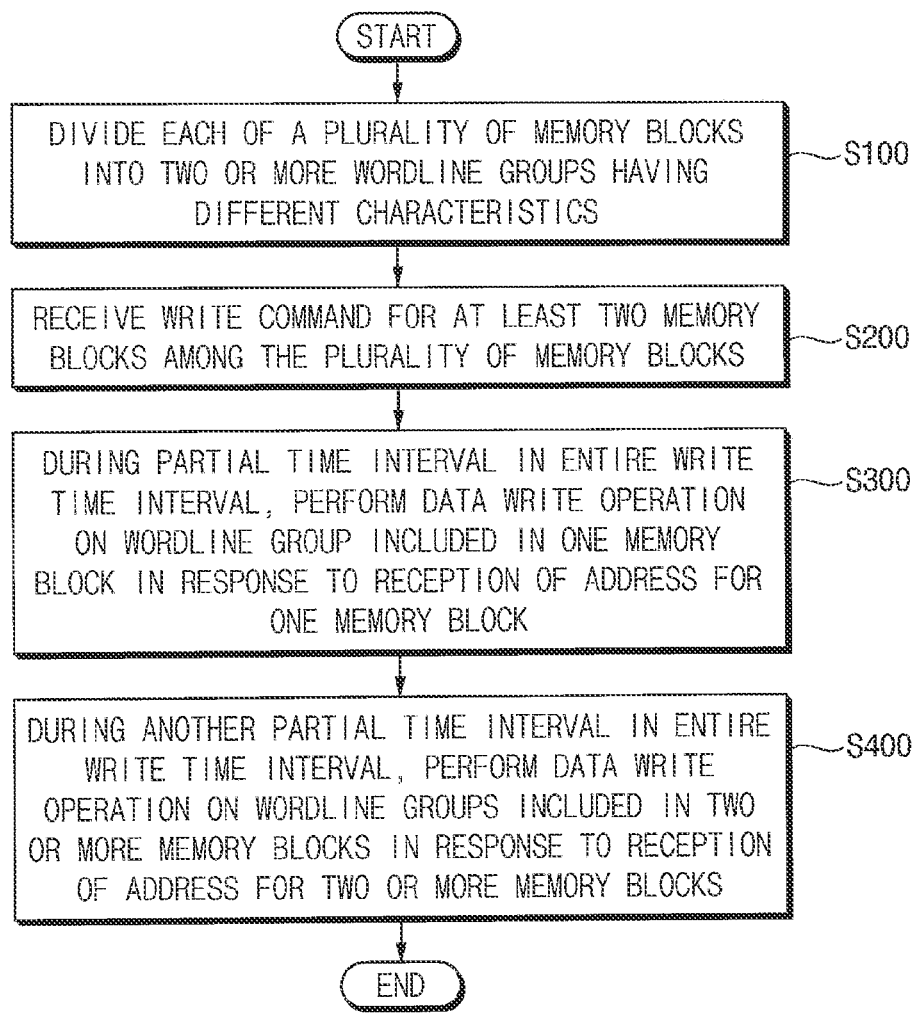
FIG. 1 is a flowchart illustrating a method of writing data in a nonvolatile memory device according to an example embodiment of the inventive concept.

The inventive concept will be described more fully with reference to the accompanying drawings, in which various exemplary embodiments thereof are shown. The present disclosure may, however, be embodied in many different forms and should not be construed as limited to the embodiments set forth herein. Like reference numerals refer to like elements throughout this application.

FIG. 1 is a flowchart illustrating a method of writing data in a nonvolatile memory device according to am example embodiment of the inventive concept.

Referring to FIG. 1, a method of writing data in a nonvolatile memory device according to an example embodiment is performed by a nonvolatile memory device that includes a plurality of memory blocks. Detailed configurations of the nonvolatile memory device and a memory system including the nonvolatile memory device will be described with reference to FIGS. 2 through 5.

In the method of writing data in the nonvolatile memory device according to an example embodiment, each of the plurality of memory blocks is divided into two or more wordline groups having different characteristics (step S100). For example, each of the plurality of memory blocks may be connected to a plurality of wordlines, and may be divided based on the plurality of wordlines. For example, each wordline group may include at least one wordline and memory cells connected thereto.

In some example embodiments, the different characteristics of the two or more wordline groups may be associated with or related to the performance (or efficiency) of each wordline group or a position (or location) of each wordline group. For example, the performance of each wordline group may include a program performance or a data retention performance. For example, the position of each wordline group may represent whether each wordline group is positioned adjacent to an edge or a center of each memory block. For example, the wordlines of a memory block of a memory device closest to a memory controller connected to the memory device and/or furthest from the memory controller could be assigned to one wordline group and the wordlines between those closest and furthest from the memory controller could be assigned to another wordline group. The step S100 of performing the grouping for each memory block will be described in more detail with reference to FIG. 6.

A write command for at least two memory blocks among the plurality of memory blocks is received (step S200). In other words, during a data write operation based on the write command, the two or more memory blocks may be operated or accessed simultaneously and/or at once (or at a time).

During a partial time interval (e.g., a first partial time interval) included in the entire write time interval for the two or more memory blocks, a data write operation is performed on a wordline group included in one memory block among the two or more memory blocks in response to a reception of an address for the one memory block (step S300). The entire write time interval represents a time interval from a start time point of a data write operation for the two or more memory blocks to an end time point of the data write operation for the two or more memory blocks.

In addition, during another partial time interval (e.g., a second partial time interval) included in the entire write time interval other than the partial time interval (e.g., the second partial time interval), a data write operation is performed on wordline groups included in the two or more memory blocks in response to a reception of an address for the two or more memory blocks (step S400). In an exemplary embodiment, a duration of the first partial time interval is the same as a duration of the second partial time interval.

In other words, when the two or more memory blocks are operated on simultaneously and/or at once in the method of writing data according to an example embodiment, the data write operation is performed using only the one memory block during the first partial time interval and is performed by mixing (e.g., interleaving) the two or more memory blocks during the second other partial time interval, rather than mixing the two or more memory blocks during the entire write time interval.

In an example embodiment, the data write operation in step S400 is performed on wordline groups that are included in different memory blocks and have different characteristics. For example, the data write operation in step S400 may be performed by mixing or interleaving a wordline group that is included in one memory block and has a first characteristic and a wordline group that is included in another memory block and has a second characteristic different from the first characteristic. Steps S300 and S400 of performing the data write operation will be described in more detail with reference to FIG. 6.

In the method of writing data in the nonvolatile memory device according to an example embodiment, each memory block is divided into the two or more wordline groups depending on the characteristics, and then the data write operation is performed by simultaneously operating on the two or more memory blocks. In addition, the data write operation is performed by mixing the wordline groups included in the different memory blocks and having the different characteristics only during the partial time interval. Accordingly, a performance variation or fluctuation that occurs depending on the wordline characteristics may be reduced or mitigated, a performance bottleneck may be reduced or eliminated, and deterioration of quality of service (QoS) may be prevented.

Figure 2:
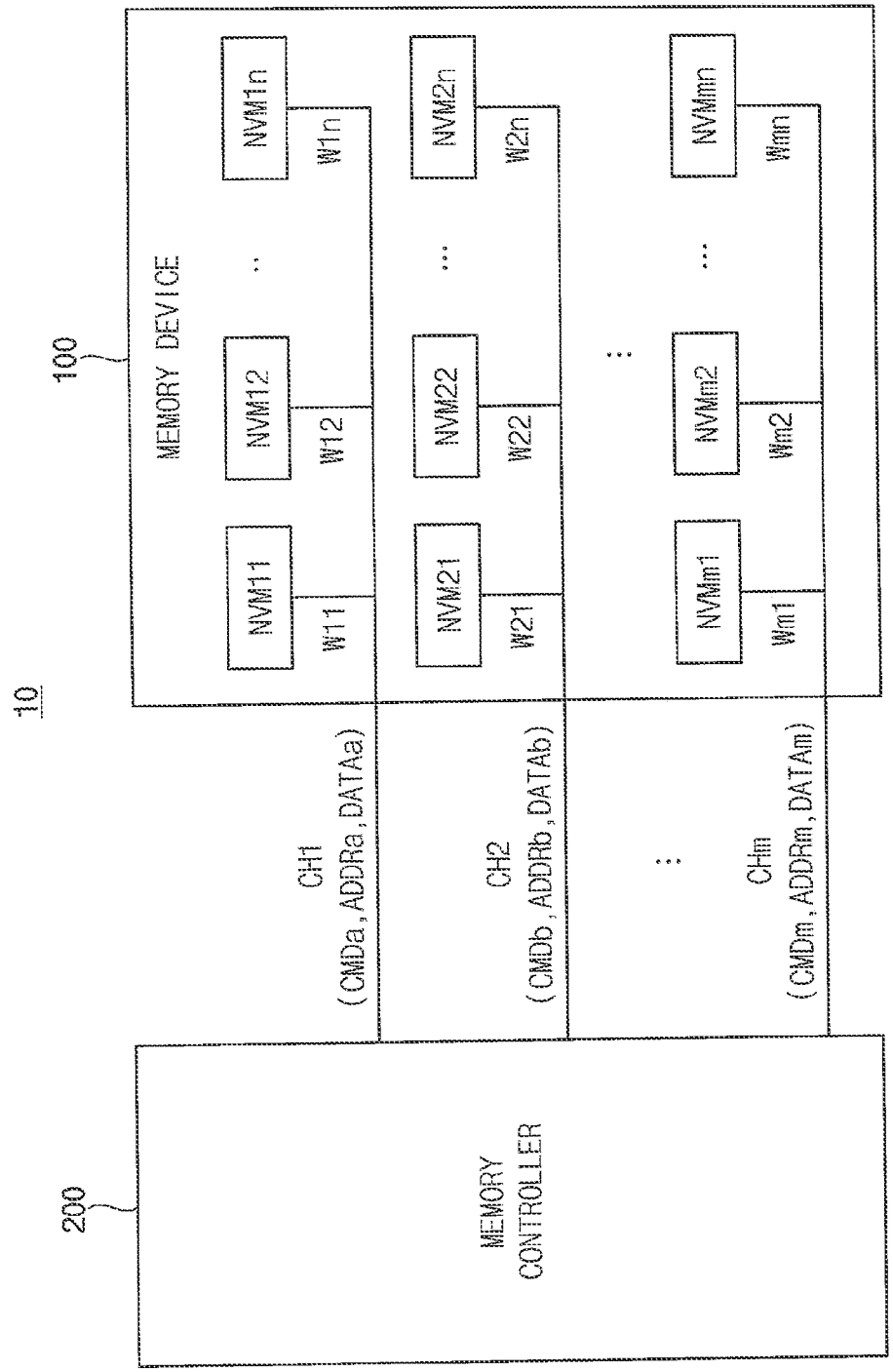
FIG. 2 is a block diagram illustrating a nonvolatile memory device and a memory system including the nonvolatile memory device according to an example embodiment of the inventive concept.

FIG. 2 is a block diagram illustrating a nonvolatile memory device and a memory system including the nonvolatile memory device according to an example embodiment of the inventive concept.

Referring to FIG. 2, a memory system 10 include a memory device 100 and a memory controller 200. The memory system 10 may support a plurality of channels CH1, CH2, . . . , CHm, and the memory device 100 may be connected to the memory controller 200 through the plurality of channels CH1 to CHm. For example, the memory system 10 may be implemented as a storage device, such as a solid state drive (SSD).

The memory device 100 may include a plurality of nonvolatile memory devices NVM11, NVM12, . . . , NVM1n, NVM21, NVM22, . . . , NVM2n, NVMm1, NVMm2, . . . , NVMmn. Each of the nonvolatile memory devices NVM11 to NVMmn may be connected to one of the plurality of channels CH1 to CHm through a corresponding way. For instance, the nonvolatile memory devices NVM11 to NVM1n may be connected to the first channel CH1 through ways W11, W12, . . . , W1n, the nonvolatile memory devices NVM21 to NVM2n may be connected to the second channel CH2 through ways W21, W22, . . . , W2n, and the nonvolatile memory devices NVMm1 to NVMmn may be connected to the m-th channel CHm through ways Wm1, Wm2, . . . , Wmn. In an example embodiment, each of the nonvolatile memory devices NVM11 to NVMmn is implemented as an arbitrary memory unit that operates according to an individual command from the memory controller 200. For example, each of the nonvolatile memory devices NVM11 to NVMmn may be implemented as a chip or a die, but example embodiments are not limited thereto. For example, two or more memory blocks operated simultaneously according to an example embodiment may be included in one nonvolatile memory device (e.g., one chip or die).

The memory controller 200 may transmit and receive signals to and from the memory device 100 through the plurality of channels CH1 to CHm. For example, the memory controller 200 may transmit commands CMDa, CMDb, . . . , CMDm, addresses ADDRa, ADDRb, . . . , ADDRm and data DATAa, DATAb, . . . , DATAm to the memory device 100 through the channels CH1 to CHm or may receive the data DATAa to DATAm from the memory device 100.

The memory controller 200 may select one of the nonvolatile memory devices NVM11 to NVMmn, which is connected to a given channel among the channels CH1 to CHm, by using the given channel, and may transmit and receive signals to and from the selected nonvolatile memory device. For example, the memory controller 200 may select the nonvolatile memory device NVM11 from among the nonvolatile memory devices NVM11 to NVM1n connected to the first channel CH1. The memory controller 200 may transmit the command CMDa, the address ADDRa and the data DATAa to the selected nonvolatile memory device NVM11 through the first channel CH1 or may receive the data DATAa from the selected nonvolatile memory device NVM11.

The memory controller 200 may transmit and receive signals to and from the memory device 100 in parallel through different channels. For example, the memory controller 200 may transmit the command CMDb to the memory device 100 through the second channel CH2 while transmitting the command CMDa to the memory device 100 through the first channel CH1. For example, the memory controller 200 may receive the data DATAb from the memory device 100 through the second channel CH2 while receiving the data DATAa from the memory device 100 through the first channel CH1.

The memory controller 200 may control overall operations of the memory device 100. The memory controller 200 may transmit a signal to the channels CH1 to CHm and may control each of the nonvolatile memory devices NVM11 to NVMmn connected to the channels CH1 to CHm. For example, the memory controller 200 may transmit the command CMDa and the address ADDRa to the first channel CH1 and may control one nonvolatile memory device selected from among the nonvolatile memory devices NVM11 to NVM1n.

Each of the nonvolatile memory devices NVM11 to NVMmn may operate under the control of the memory controller 200. For example, the nonvolatile memory device NVM11 may program the data DATAa based on the command CMDa, the address ADDRa and the data DATAa provided from the memory controller 200 through the first channel CH1. For example, the nonvolatile memory device NVM21 may read the data DATAb based on the command CMDb and the address ADDRb provided from the memory controller 200 through the second channel CH2 and may transmit the read data DATAb to the memory controller 200 through the second channel CH2.

Although FIG. 2 illustrates an example where the memory device 100 communicates with the memory controller 200 through m channels and includes n nonvolatile memory devices corresponding to each of the channels, the number of channels and the number of nonvolatile memory devices connected to one channel may be variously changed according to example embodiments.

Figure 3:
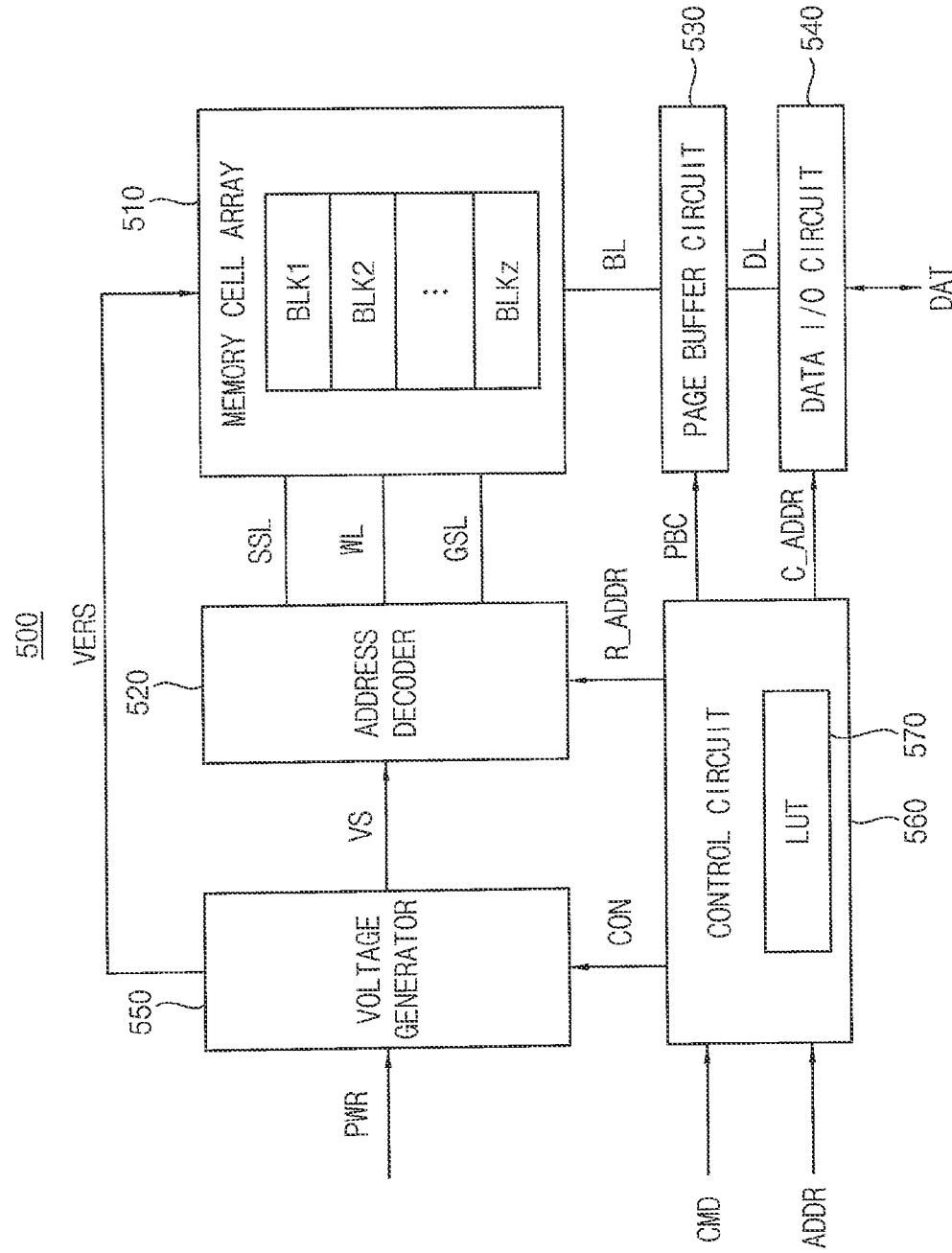
FIG. 3 is a block diagram illustrating a nonvolatile memory device according to an example embodiment of the inventive concept.

FIG. 3 is a block diagram illustrating a nonvolatile memory device according to an example embodiment of the inventive concept.

Referring to FIG. 3, a nonvolatile memory device 500 includes a memory cell array 510, an address decoder 520, a page buffer circuit 530, a data input/output (I/O) circuit 540, a voltage generator 550 and a control circuit 560. The memory device 100 of FIG. 2 may be implemented using the nonvolatile memory device 500.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1 to BLKz may be divided into a plurality of pages.

In an example embodiment, the plurality of memory cells included in the memory cell array 510 are arranged in a two dimensional (2D) array structure or a three dimensional (3D) vertical array structure. The 3D vertical array structure may include vertical cell strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 560 receives a command CMD and an address ADDR from the outside (e.g., from the memory controller 200 in FIG. 2), and controls erasure, programming and read operations of the nonvolatile memory device 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 560 may generate control signals CON, which are used for controlling the voltage generator 550, and may generate a control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The control circuit 560 may perform the method of writing data according to an example embodiment. The control circuit 560 may include a look-up table (LUT) 570 that is used while performing the method of writing data according to an example embodiment. For example, the look-up table 570 may include information (e.g., wordline group information) associated with two or more wordline groups included in each memory block obtained by step S100 in FIG. 1. For example, the wordline group information may indicate for each memory block, which wordlines are assigned to a first wordline group having a first characteristic, which wordlines are assigned to a second wordline group having a second other characteristic, etc. In an example embodiment, the wordline group information is determined while the nonvolatile memory device 500 is manufactured and is stored in the nonvolatile memory device 500 in advance. In an example embodiment, the wordline group information is updated in real time (or during runtime) while the nonvolatile memory device 500 is driven as will be described with reference to FIG. 18.

In an exemplary embodiment, the control circuit 560 receives a write command for simultaneously operating two or more memory blocks among the memory blocks BLK1 to BLKz, performs a data write operation on only one memory block during a partial write time interval, and may performs a data write operation by mixing wordline groups that are included in two or more memory blocks and have different characteristics during another partial write time interval.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory device 500 based on a power PWR (e.g., a received power supply voltage) and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS used for the data erase operation based on the power PWR and the control signals CON. The erase voltage VERS may be applied to the memory cell array 510 directly or via the bitline BL.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recover read operation, the voltage generator 550 may apply the read voltage to a wordline adjacent to the selected wordline and may apply a recover read voltage to the selected wordline via the address decoder 520.

The page buffer circuit 530 may be connected to the memory cell array 510 via the plurality of bitlines BL. The page buffer circuit 530 may include a plurality of page buffers. In an example embodiment, each page buffer is connected to one bitline. In another example embodiment, each page buffer is connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory device 500.

The data I/O circuit 540 may be connected to the page buffer circuit 530 via data lines DL. The data I/O circuit 540 may provide the data DAT from the outside of the nonvolatile memory device 500 to the memory cell array 510 via the page buffer circuit 530 or may provide the data DAT from the memory cell array 510 to the outside of the nonvolatile memory device 500, based on the column address C_ADDR.

Although the nonvolatile memory device according to an example embodiment is described based on a NAND flash memory device, the nonvolatile memory device according to example embodiments may be any nonvolatile memory device. For example, the nonvolatile memory device may include a phase random access memory (PRAM), a resistive random access memory (RRAM), a nano floating gate memory (NFGM), a polymer random access memory (PoRAM), a magnetic random access memory (MRAM), a ferroelectric random access memory (FRAM), or a thyristor random access memory (TRAM).

Figure 4:
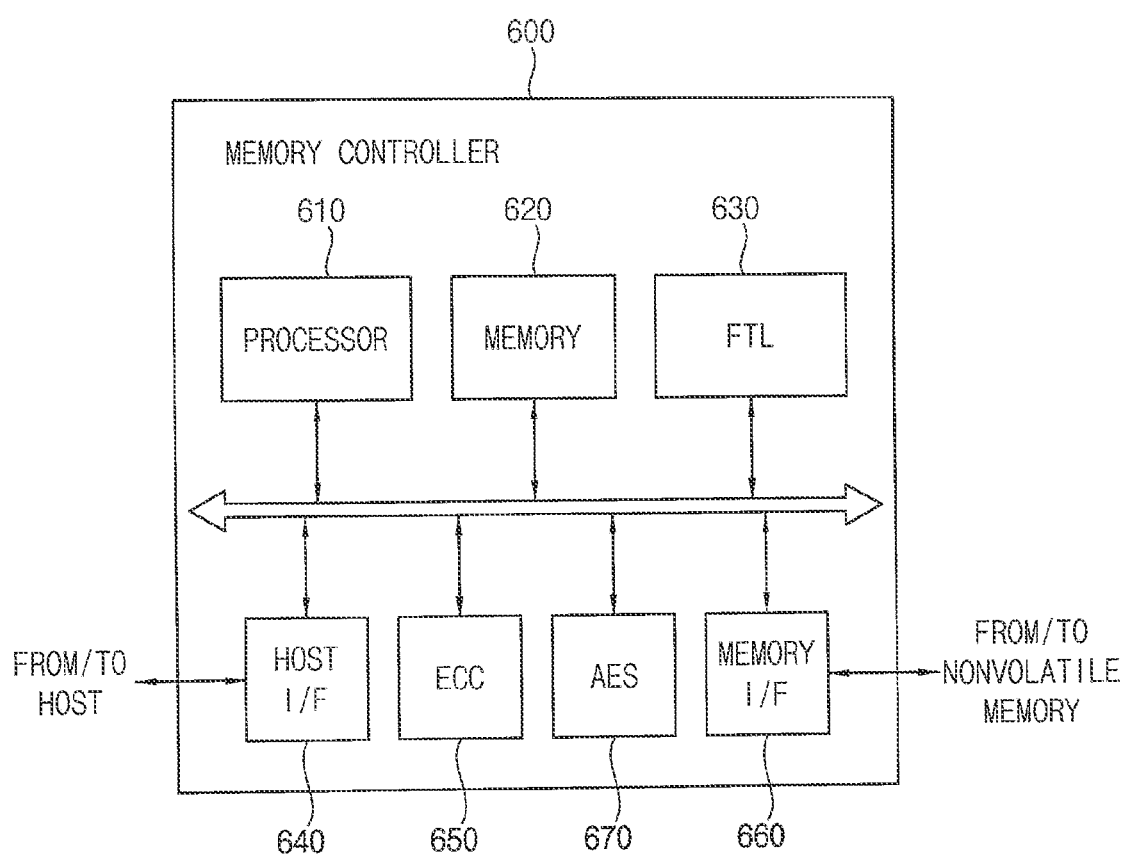
FIG. 4 is a block diagram illustrating an example of a memory controller included in a memory system according to an example embodiment of the inventive concept.

FIG. 4 is a block diagram illustrating an example of a memory controller included in a memory system according to example embodiment of the inventive concept.

Referring to FIG. 4, a memory controller 600 includes a processor 610, a memory (or buffer memory) 620, a flash translation layer (FTL) 630, a host interface 640 (e.g., an interface circuit), an error correction code (ECC) engine 650 (e.g., an error correction circuit), a memory interface 660 (e.g., an interface circuit) and an advanced encryption standard (AES) engine 670 (e.g., a logic circuit, encryption circuit, decryption circuit, etc.). The memory controller 200 of FIG. 2 may be implemented using the memory controller 600.

Figure 20:
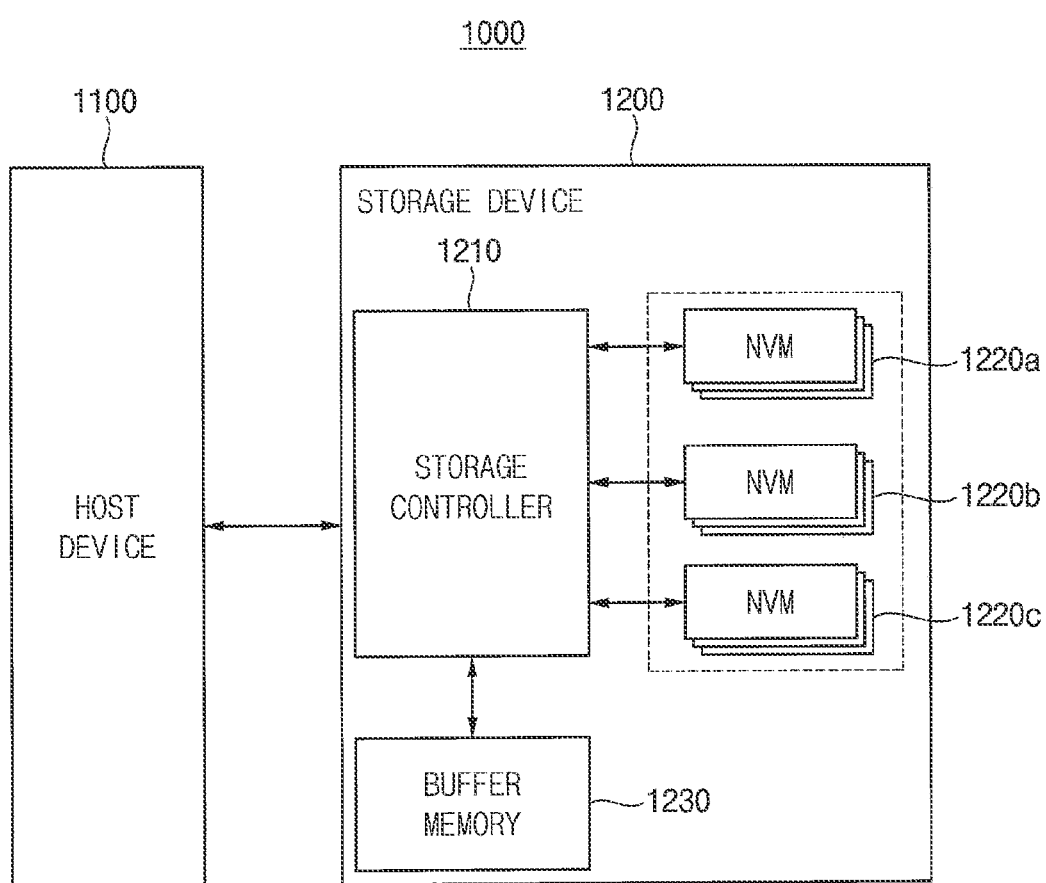
FIG. 20 is a block diagram illustrating a storage device and a storage system including the storage device according to an example embodiment of the inventive concept.

The processor 610 may control an operation of the memory controller 600 in response to a command received via the host interface 640 from a host device (e.g., a host device 1100 in FIG. 20). For example, the processor 610 may control an operation of a memory system (e.g., the memory system 10 of FIG. 2), and may control respective components by employing firmware for operating the memory system.

The memory 620 may store instructions and data executed and processed by the processor 610. For example, the memory 620 may be implemented with a volatile memory with a relatively small capacity and high speed, such as a static random access memory (SRAM) or a cache memory.

The FTL 630 may perform various functions, such as an address mapping operation, a wear-leveling operation, or a garbage collection operation. The address mapping operation may be an operation of converting a logical address received from the host device into a physical address used to actually store data in a nonvolatile memory device (e.g., the nonvolatile memory device 500 of FIG. 3). The wear-leveling operation may be a technique for preventing excessive deterioration of a specific block by allowing blocks of the nonvolatile memory device to be uniformly used. As an example, the wear-leveling operation may be implemented using a firmware technique that balances erase counts of physical blocks. The garbage collection operation may be a technique for ensuring usable capacity in the nonvolatile memory device by erasing an existing block after copying valid data of the existing block to a new block.

The ECC engine 650 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 640 may provide physical connections between the host device and the memory system. The host interface 640 may provide an interface corresponding to a bus format of the host device for communication between the host device and the memory system. In an example embodiment, the bus format of the host device is a small computer system interface (SCSI) or a serial attached SCSI (SAS) interface. In example embodiments, the bus format of the host device may be a universal serial bus (USB) format, a peripheral component interconnect (PCI) express (PCIe) format, an advanced technology attachment (ATA) format, a parallel ATA (PATA) format, a serial ATA (SATA) format, or a nonvolatile memory (NVM) express (NVMe) format.

The memory interface 660 may exchange data with the nonvolatile memory device (e.g., 100, 500, etc.). The memory interface 660 may transfer data to the nonvolatile memory device, or may receive data read from the nonvolatile memory device. In an example embodiment, the memory interface 660 is connected to the nonvolatile memory device via one channel. In another example embodiment, the memory interface 660 is connected to the nonvolatile memory device via two or more channels. For example, the memory interface 660 may be configured to comply with a standard protocol, such as Toggle or open NAND flash interface (ONFI).

The AES engine 670 may perform at least one of an encryption operation and a decryption operation on data input to the memory controller 600 by using a symmetric-key algorithm. Although not illustrated in detail, the AES engine 670 may include an encryption module and a decryption module. In some example embodiments, the encryption module and the decryption module may be implemented as separate modules or circuits. In other example embodiments, one module or circuit capable of performing both encryption and decryption operations may be implemented in the AES engine 670.

Figure 5:
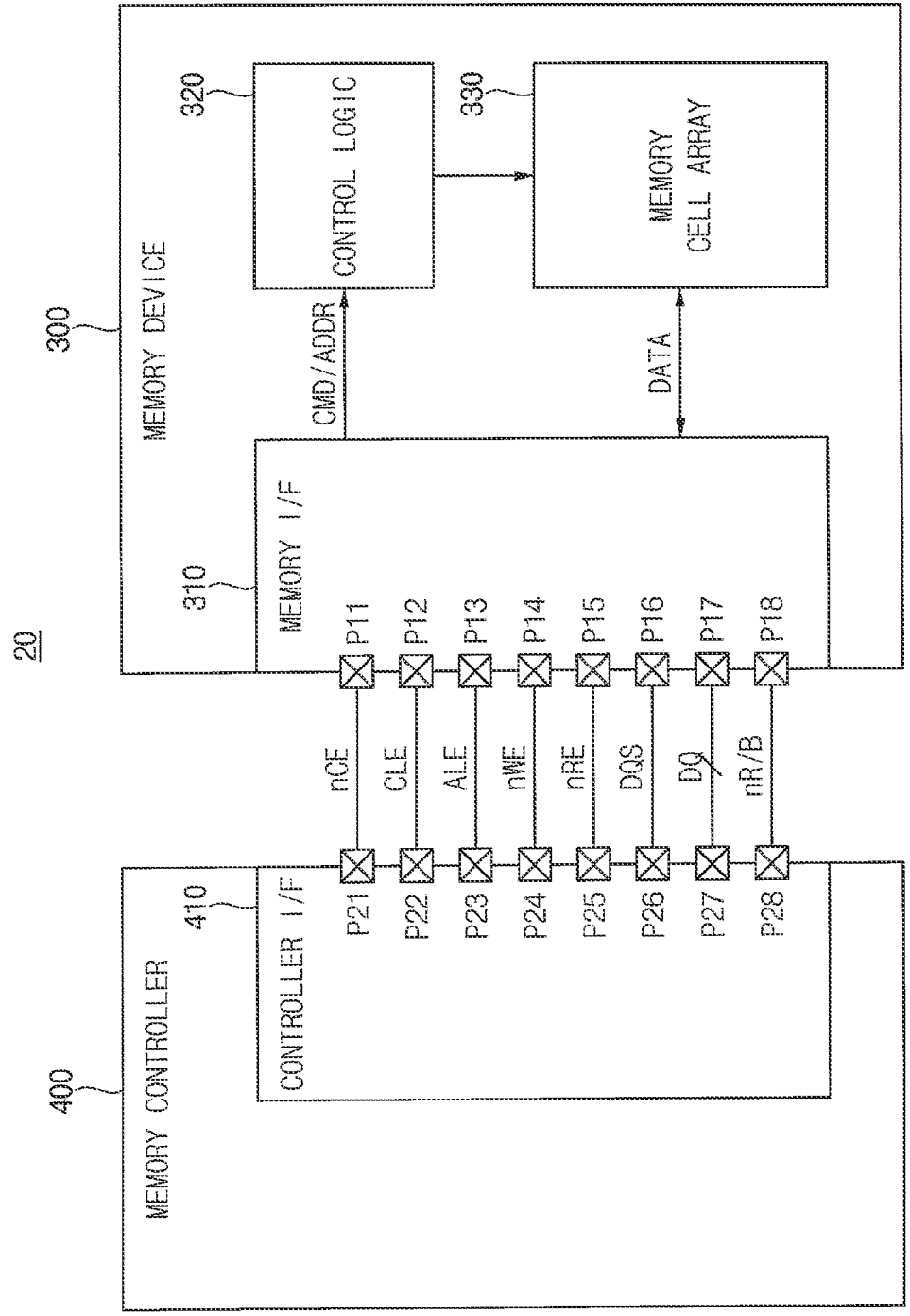
FIG. 5 is a block diagram illustrating a memory system according to an example embodiment of the inventive concept.

FIG. 5 is a block diagram illustrating a memory system according to an example embodiment of the inventive concept.

Referring to FIG. 5, a memory system 20 include a memory device 300 and a memory controller 400. The memory device 300 may correspond to one of the nonvolatile memory devices NVM11 to NVMmn in FIG. 2, which communicate with the memory controller 200 in FIG. 3 based on one of the channels CH1 to CHm in FIG. 3. The memory controller 400 may correspond to the memory controller 200 in FIG. 3.

The memory device 300 may include first to eighth pins P11, P12, P13, P14, P15, P16, P17 and P18, a memory interface circuit 310, a control logic circuit 320 and a memory cell array 330.

The memory interface circuit 310 may receive a chip enable signal nCE from the memory controller 400 through the first pin P11. The memory interface circuit 310 may transmit and receive signals to and from the memory controller 400 through the second to eighth pins P12 to P18 in response to the chip enable signal nCE. For example, when the chip enable signal nCE is in an enable state (e.g., a low level), the memory interface circuit 310 may transmit and receive signals to and from the memory controller 400 through the second to eighth pins P12 to P18.

The memory interface circuit 310 may receive a command latch enable signal CLE, an address latch enable signal ALE and a write enable signal nWE from the memory controller 400 through the second to fourth pins P12 to P14. The memory interface circuit 310 may receive a data signal DQ from the memory controller 400 through the seventh pin P17 or may transmit the data signal DQ to the memory controller 400. A command CMD, an address ADDR and data DATA may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuit 310 may obtain the command CMD from the data signal DQ, which is received in an enable section (e.g., a high-level state) of the command latch enable signal CLE based on toggle time points of the write enable signal nWE. The memory interface circuit 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE is maintained at a static state (e.g., a high level or a low level) and toggles between the high level and the low level. For example, the write enable signal nWE may toggle in a section in which the command CMD or the address ADDR is transmitted. Thus, the memory interface circuit 310 may obtain the command CMD or the address ADDR based on the toggle time points of the write enable signal nWE.

The memory interface circuit 310 may receive a read enable signal nRE from the memory controller 400 through the fifth pin P15. The memory interface circuit 310 may receive a data strobe signal DQS from the memory controller 400 through the sixth pin P16 or may transmit the data strobe signal DQS to the memory controller 400.

In a data output operation of the memory device 300, the memory interface circuit 310 may receive the read enable signal nRE, which toggles through the fifth pin P15, before outputting the data DATA. The memory interface circuit 310 may generate the data strobe signal DQS, which toggles based on the toggling of the read enable signal nRE. For example, the memory interface circuit 310 may generate the data strobe signal DQS, which starts toggling after a predetermined delay (e.g., tDQSRE), based on a toggling start time of the read enable signal nRE. The memory interface circuit 310 may transmit the data signal DQ including the data DATA based on a toggle time point of the data strobe signal DQS. Thus, the data DATA may be aligned with the toggle time point of the data strobe signal DQS and may be transmitted to the memory controller 400.

In a data input operation of the memory device 300, when the data signal DQ including the data DATA is received from the memory controller 400, the memory interface circuit 310 may receive the data strobe signal DQS, which toggles, along with the data DATA from the memory controller 400. The memory interface circuit 310 may obtain the data DATA from the data signal DQ based on toggle time points of the data strobe signal DQS. For example, the memory interface circuit 310 may sample the data signal DQ at rising and falling edges of the data strobe signal DQS and may obtain the data DATA.

The command CMD, the address ADDR and the data DATA that are obtained based on the write enable signal nWE and the data strobe signal DQS may correspond to a command, an address and data that are used to perform the data write operation according to an example embodiment.

The memory interface circuit 310 may transmit a ready/busy output signal nR/B to the memory controller 400 through the eighth pin P18. The memory interface circuit 310 may transmit state information of the memory device 300 through the ready/busy output signal nR/B to the memory controller 400. When the memory device 300 is in a busy state (e.g., when operations are being performed in the memory device 300), the memory interface circuit 310 may transmit the ready/busy output signal nR/B indicating the busy state to the memory controller 400. When the memory device 300 is in a ready state (e.g., when operations are not performed or have completed in the memory device 300), the memory interface circuit 310 may transmit the ready/busy output signal nR/B indicating the ready state to the memory controller 400. For example, while the memory device 300 is reading the data DATA from the memory cell array 330 in response to a page read command, the memory interface circuit 310 may transmit the ready/busy output signal nR/B indicating the busy state (e.g., a low level) to the memory controller 400. For example, while the memory device 300 is programming the data DATA to the memory cell array 330 in response to a program command, the memory interface circuit 310 may transmit the ready/busy output signal nR/B indicating the busy state to the memory controller 400.

The control logic circuit 320 may control overall operations of the memory device 300. The control logic circuit 320 may receive the command CMD and the address ADDR obtained from the memory interface circuit 310. The control logic circuit 320 may generate control signals for controlling other components of the memory device 300 in response to the received command CMD and the received address ADDR. For example, the control logic circuit 320 may generate various control signals for programming the data DATA to the memory cell array 330 or for reading the data DATA from the memory cell array 330.

The memory cell array 330 may store the data DATA obtained from the memory interface circuit 310, under the control of the control logic circuit 320. The memory cell array 330 may output the stored data DATA to the memory interface circuit 310 under the control of the control logic circuit 320.

The memory cell array 330 may include a plurality of memory cells. For example, the plurality of memory cells may be flash memory cells. However, example embodiments are not limited thereto, and the memory cells may be RRAM cells, FRAM cells, PRAM cells, thyristor RAM (TRAM) cells, or MRAM cells. Hereinafter, an example in which the memory cells are NAND flash memory cells will mainly be described.

The memory controller 400 may include first to eighth pins P21, P22, P23, P24, P25, P26, P27 and P28 and a controller interface circuit 410. The first to eighth pins P21 to P28 may correspond to the first to eighth pins P11 to P18 of the memory device 300, respectively.

The controller interface circuit 410 may transmit the chip enable signal nCE to the memory device 300 through the first pin P21. The controller interface circuit 410 may transmit and receive signals to and from the memory device 300, which is selected by the chip enable signal nCE, through the second to eighth pins P22 to P28.

The controller interface circuit 410 may transmit the command latch enable signal CLE, the address latch enable signal ALE and the write enable signal nWE to the memory device 300 through the second to fourth pins P22 to P24. The controller interface circuit 410 may transmit or receive the data signal DQ to and from the memory device 300 through the seventh pin P27.

The controller interface circuit 410 may transmit the data signal DQ including the command CMD or the address ADDR to the memory device 300 along with the write enable signal nWE, which toggles. The controller interface circuit 410 may transmit the data signal DQ including the command CMD to the memory device 300 by transmitting the command latch enable signal CLE having an enable state. Also, the controller interface circuit 410 may transmit the data signal DQ including the address ADDR to the memory device 300 by transmitting the address latch enable signal ALE having an enable state.

The controller interface circuit 410 may transmit the read enable signal nRE to the memory device 300 through the fifth pin P25. The controller interface circuit 410 may receive or transmit the data strobe signal DQS from or to the memory device 300 through the sixth pin P26.

In a data output operation of the memory device 300, the controller interface circuit 410 may generate the read enable signal nRE, which toggles, and may transmit the read enable signal nRE to the memory device 300. For example, before outputting the data DATA, the controller interface circuit 410 may generate the read enable signal nRE, which is changed from a static state (e.g., a high level or a low level) to a toggling state. Thus, the memory device 300 may generate the data strobe signal DQS, which toggles, based on the read enable signal nRE. The controller interface circuit 410 may receive the data signal DQ including the data DATA along with the data strobe signal DQS, which toggles, from the memory device 300. The controller interface circuit 410 may obtain the data DATA from the data signal DQ based on a toggle time point of the data strobe signal DQS.

In a data input operation of the memory device 300, the controller interface circuit 410 may generate the data strobe signal DQS, which toggles. For example, before transmitting the data DATA, the controller interface circuit 410 may generate the data strobe signal DQS, which is changed from a static state (e.g., a high level or a low level) to a toggling state. The controller interface circuit 410 may transmit the data signal DQ including the data DATA to the memory device 300 based on toggle time points of the data strobe signal DQS.

The controller interface circuit 410 may receive the ready/busy output signal nR/B from the memory device 300 through the eighth pin P28. The controller interface circuit 410 may determine state information of the memory device 300 based on the ready/busy output signal nR/B.

Figure 6:
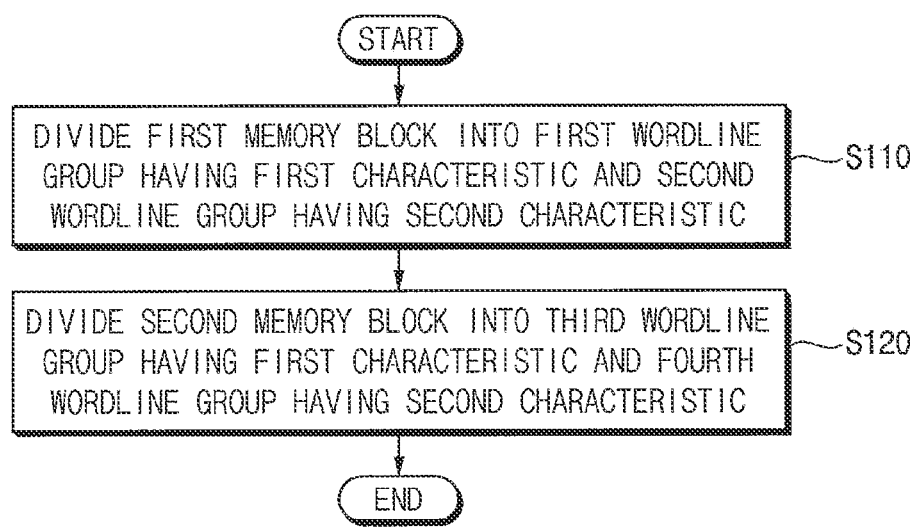
FIG. 6 is a flowchart illustrating an example of dividing each of a plurality of memory blocks into two or more wordline groups in FIG. 1.
Figure 7:
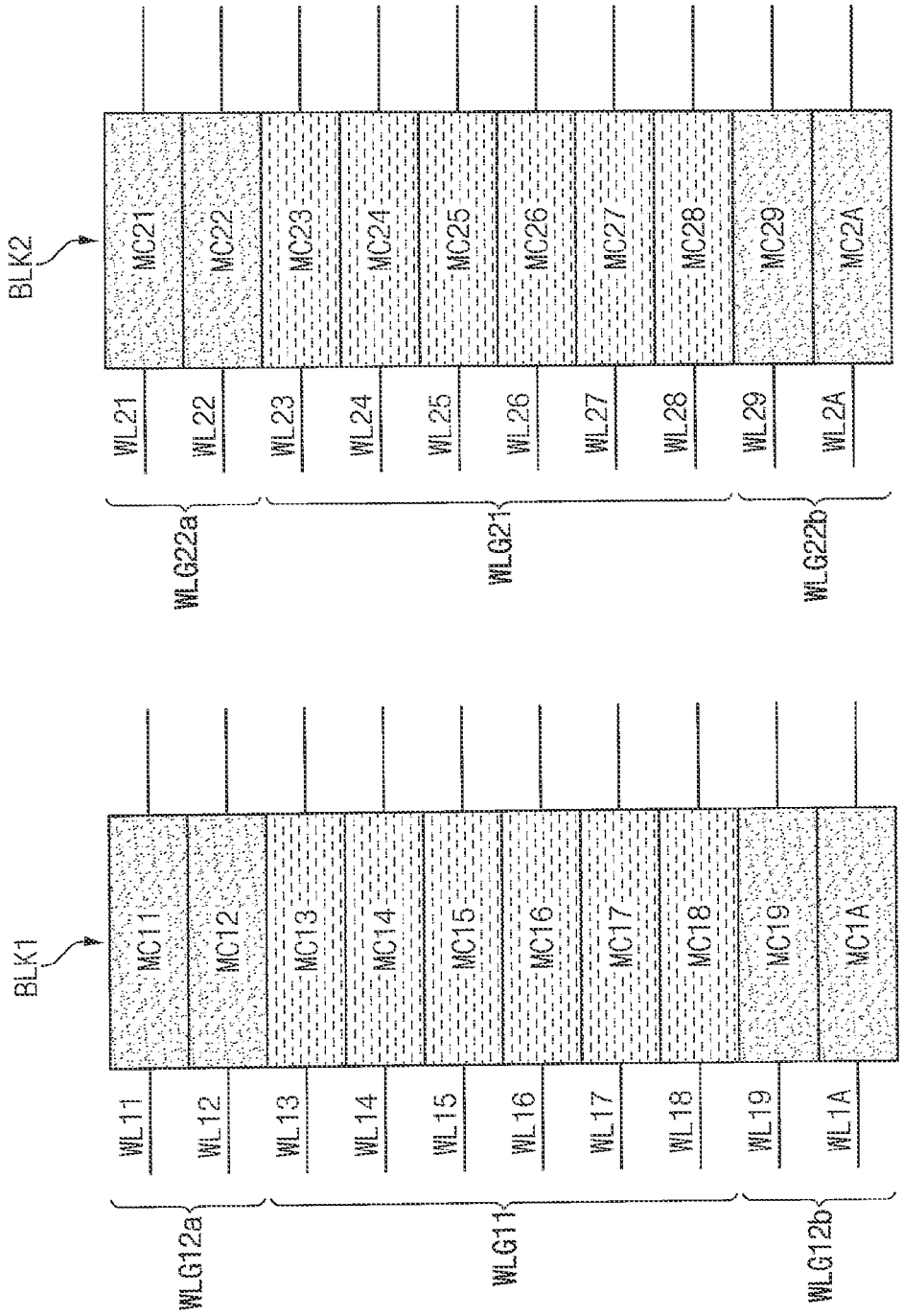
FIG. 7 is a diagram for describing an operation of FIG. 6.

FIG. 6 is a flowchart illustrating an example of dividing each of a plurality of memory blocks into two or more wordline groups in FIG. 1. FIG. 7 is a diagram for describing an operation of FIG. 6.

Referring to FIGS. 1, 6 and 7, in step S100, a first memory block BLK1 is divided into a first wordline group WLG11 having a first characteristic and a second wordline group WLG12a and WLG12b having a second characteristic (step S110). For example, the first memory block BLK1 may be connected to wordlines WL11, WL12, WL13, WL14, WL15, WL16, WL17, WL18, WL19 and WL1A, and may include memory cells MC11, MC12, MC13, MC14, MC15, MC16, MC17, MC18, MC19 and MC1A connected thereto. The wordlines WL13 to WL18 and the memory cells MC13 to MC18 may be set as the first wordline group WLG11. The wordlines WL11, WL12, WL19 and WL1A and the memory cells MC11, MC12, MC19 and MC1A may be set as the second wordline group WLG12a and WLG12b.

In addition, a second memory block BLK2 is divided into a third wordline group WLG21 having the first characteristic and a fourth wordline group WLG22a and WLG22b having the second characteristic (step S120). For example, in the second memory block BLK2, wordlines WL23, WL24, WL25, WL26, WL27 and WL28 and memory cells MC23, MC24, MC25, MC26, MC27 and MC28 connected thereto may be set as the third wordline group WLG21. In addition, in the second memory block BLK2, wordlines WL21, WL22, WL29 and WL2A and memory cells MC21, MC22, MC29 and MC2A connected thereto may be set as the fourth wordline group WLG22a and WLG22b.

In an example embodiment, the first and second characteristics is determined based on the program performance (e.g., program speed and/or program time) of the wordlines. For example, the first and third wordline groups WLG11 and WLG21 may include wordlines having a program performance higher than a reference program performance (or a first reference value). The second and fourth wordline groups WLG12a, WLG12b, WLG22a and WLG22b may include wordlines having a program performance lower than or equal to the reference program performance.

In another example embodiment, the first and second characteristics are determined based on the data retention performance of the wordlines. For example, the first and third wordline groups WLG11 and WLG21 may include wordlines having a data retention performance higher than a reference data retention performance (or a second reference value). The second and fourth wordline groups WLG12a, WLG12b, WLG22a and WLG22b may include wordlines having a data retention performance lower than or equal to the reference data retention performance.

In an example embodiment, the first and second characteristics are determined based on the positions of the wordlines in the memory blocks. For example, the second and fourth wordline groups WLG12a, WLG12b, WLG22a and WLG22b may include edge wordlines, e.g., wordlines positioned adjacent to edges of the first and second memory blocks BLK1 and BLK2. The first and third wordline groups WLG11 and WLG21 may include center wordlines, e.g., wordlines positioned adjacent to centers of the first and second memory blocks BLK1 and BLK2.

However, the inventive concept is not limited thereto, and the conditions and/or criteria for determining the first and second characteristics may be variously changed according to example embodiments.

In an example embodiment, the number of bits of data stored in the memory cells included in the wordline groups WLG11 and WLG21 having the first characteristic is different from the number of bits of data stored in the memory cells included in the wordline groups WLG12a, WLG12b, WLG22a and WLG22b having the second characteristic. For example, if the first characteristic is a characteristic superior to the second characteristic, the memory cells (e.g., the memory cells MC13 to MC18 and MC23 to MC28) included in the wordline groups WLG11 and WLG21 are triple-level cells (TLCs) (e.g., each cell stores three bits of data), and the memory cells (e.g., the memory cells MC11, MC12, MC19, MC1A, MC21, MC22, MC29 and MC2A) included in the wordline groups WLG12a, WLG12b, WLG22a and WLG22b are multi-level cells (MLCs). In an embodiment, the TLCs are replaced with multi-level cells (MLCs) that store two bits of data. However, example embodiments are not limited thereto.

In an example embodiment, step S100 is performed once at the time of manufacturing the nonvolatile memory device, and the wordline group information is stored in the look-up table (e.g., the look-up table 570 in FIG. 3). In this example, when the nonvolatile memory device is driven after the manufacturing process, step S100 may be replaced with an operation of loading the wordline group information stored in the look-up table.

Figure 8:
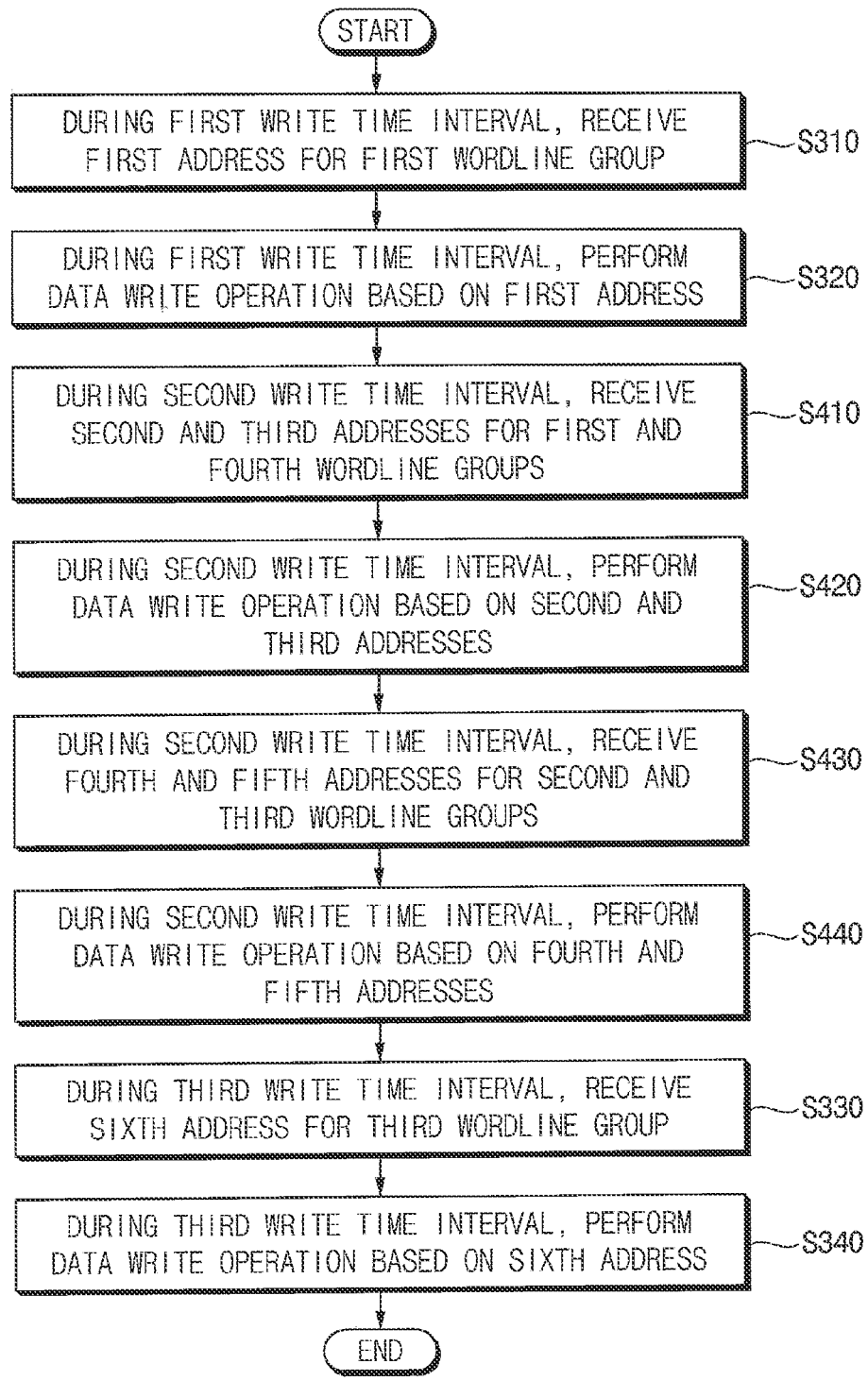
FIG. 8 is a flowchart illustrating an example of performing a data write operation on a wordline group included in one memory block and performing a data write operation on wordline groups included in two or more memory blocks in FIG. 1.

FIG. 8 is a flowchart illustrating an example of performing a data write operation on a wordline group included in one memory block and performing a data write operation on wordline groups included in two or more memory blocks in FIG. 1. FIGS. 9, 10A, 10B, 10C, 10D, 10E, 10F, 10G, 10H, 10I and 10J are diagrams for describing an operation of FIG. 8.

Referring to FIGS. 1, 8, 9, 10A, 10B, 10C, 10D, 10E, 10F, 10G, 10H, 10I and 10J, in steps S300 and S400, the entire write time interval for the first and second memory blocks BLK1 and BLK2 includes a first write time interval TW1, a second write time interval TW2 and a third write time interval TW3.

Figure 10A:
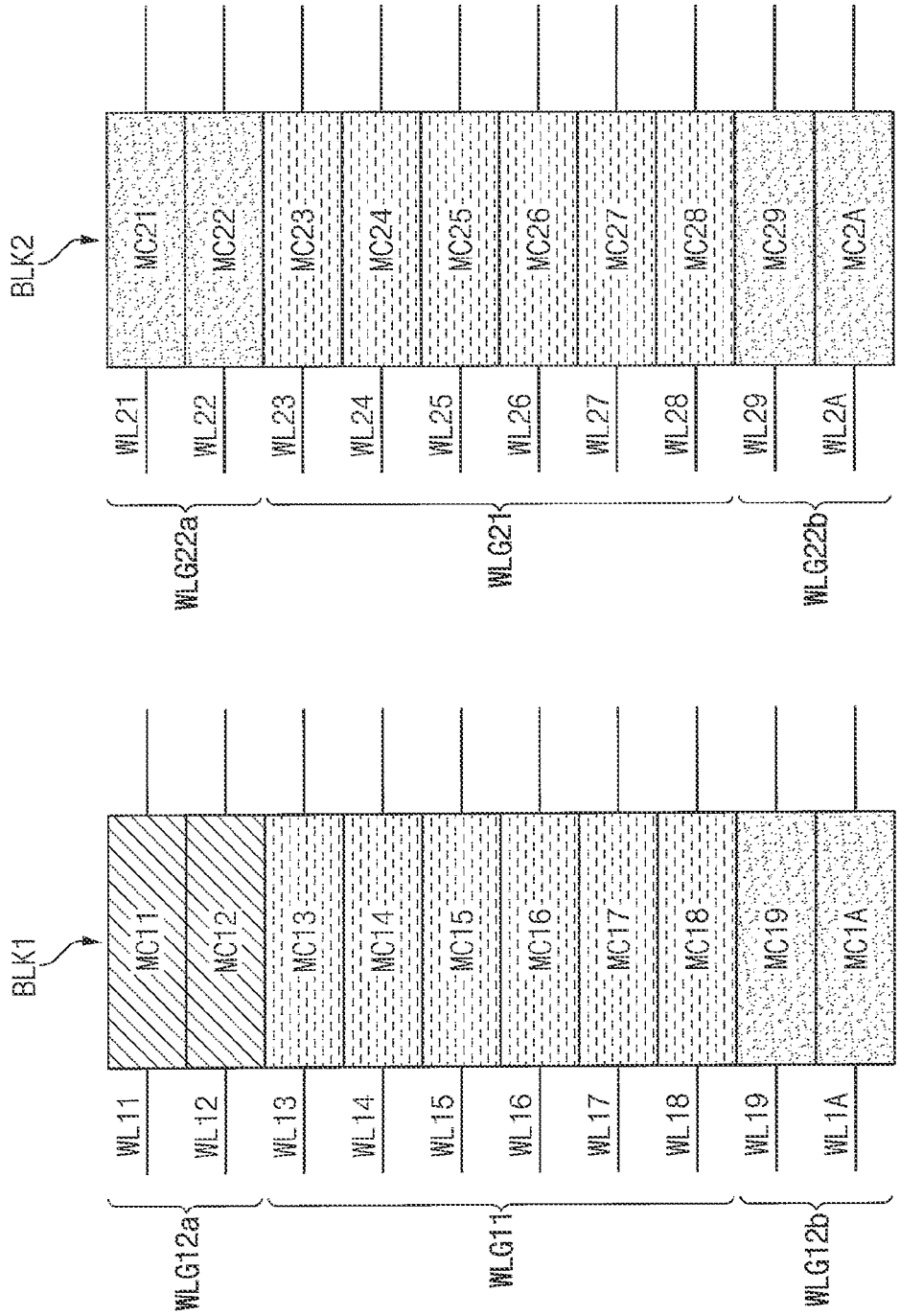

Hereinafter, example embodiments will be described based on an example where the first and third wordline groups WLG11 and WLG21 have relatively good characteristics and the second and fourth wordline groups WLG12a, WLG12b, WLG22a and WLG22b have relatively bad or poor characteristics. In other words, data is written into the first wordline group WLG11 or the third wordline group WLG21 alone without mixing another wordline group, and data is written into the second wordline group WLG12a and WLG12b or the fourth wordline group WLG22a and WLG22b with mixing another wordline group to prevent performance degradation. In addition, example embodiments will be described based on an example where two wordlines are selected and a data write operation is performed on the selected two wordlines during one unit interval. In FIG. 10A and following figures, wordlines and memory cells selected and written during one unit interval are illustrated by hatched portions.

In step S300, during the first write time interval TW1, first addresses A13, A14, A15 and A16 for first selected wordlines WL13 to WL16 included in the first wordline group WLG11 are received (step S310), and a data write operation is performed on the first selected wordlines WL13 to WL16 and the memory cells MC13 to MC16 connected thereto based on the first addresses A13 to A16 (step S320). For example, as illustrated in FIG. 10B, the data write operation may be performed on the wordlines WL13 and WL14 and the memory cells MC13 and MC14 during one unit interval. Subsequently, as illustrated in FIG. 10C, the data write operation may be performed on the wordlines WL15 and WL16 and the memory cells MC15 and MC16 during one unit interval.

Figure 10E:
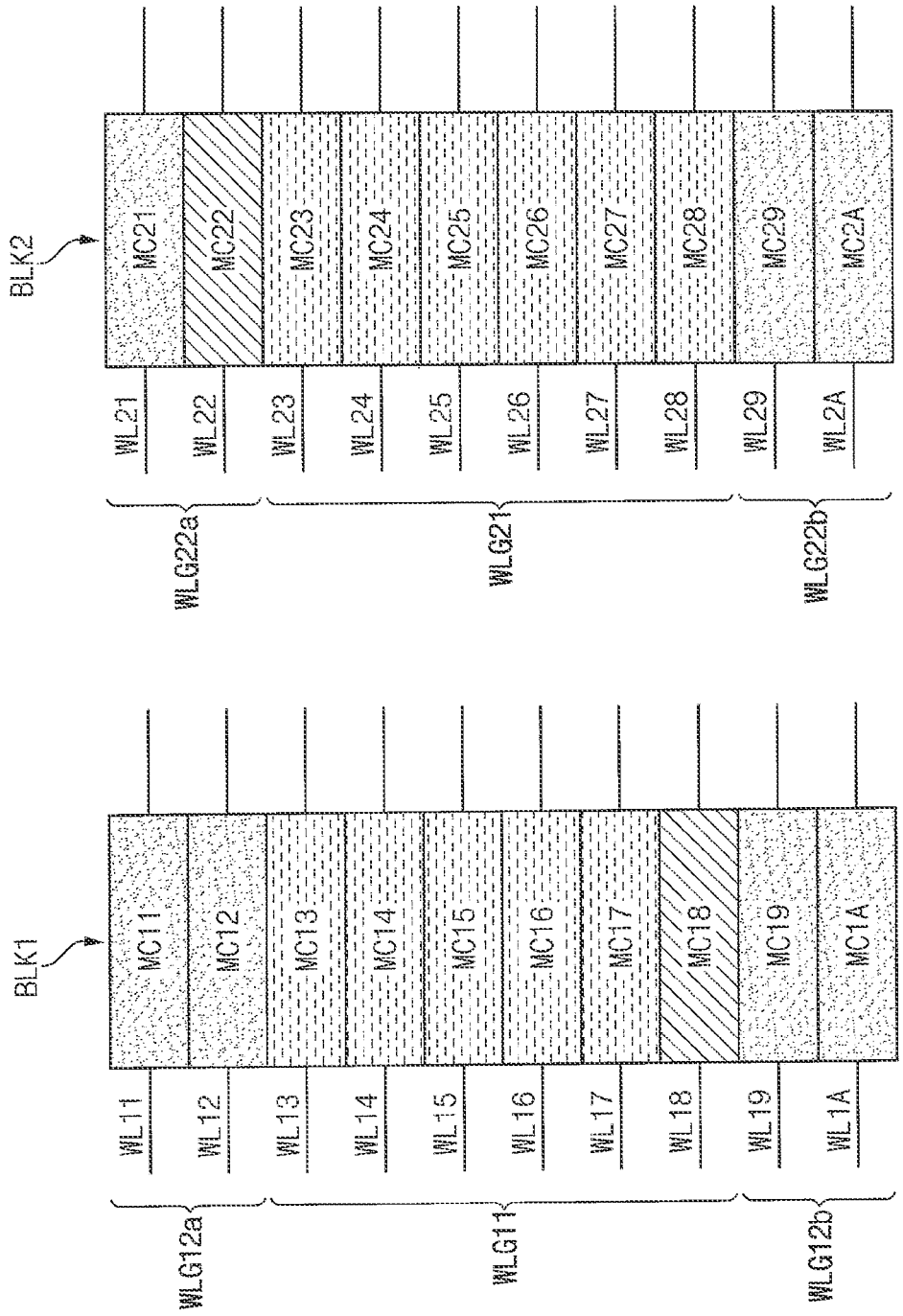

In step S400, during the second write time interval TW2, second addresses A17 and A18 for second selected wordlines WL17 and WL18 included in the first wordline group WLG11 and third addresses A21 and A22 for third selected wordlines WL21 and WL22 included in the fourth wordline group WLG22a are received (step S410), and a data write operation is performed on the second and third selected wordlines WL17, WL18, WL21 and WL22 based on the second and third addresses A17, A18, A21 and A22 (step S420). For example, as illustrated in FIG. 10D, the data write operation is performed on the wordlines WL17 and WL21 and the memory cells MC17 and MC21 during one unit interval. Subsequently, as illustrated in FIG. 10E, the data write operation is performed on the wordlines WL18 and WL22 and the memory cells MC18 and MC22 during one unit interval. For example, two addresses of the first memory block BLK1 in a wordline group of a first characteristic are received and two addresses of the second memory block BLK2 of a second other characteristic are received; a location of the first memory block BLK1 corresponding to a first one of the two addresses of the first memory block BLK1 is written and a location of the second memory block BLK2 corresponding to a first one of the two addresses of the second memory block BLK2 is written during a first time of the second write time interval TW2; and a location of the first memory block BLK1 corresponding to a second address of the two addresses of the first memory block BLK1 is written and a location of the second memory block BLK2 corresponding to a second address of the two addresses of the second memory block BLK2 is written during a second time of the second write time interval TW2 after the first time.

Figure 10F:
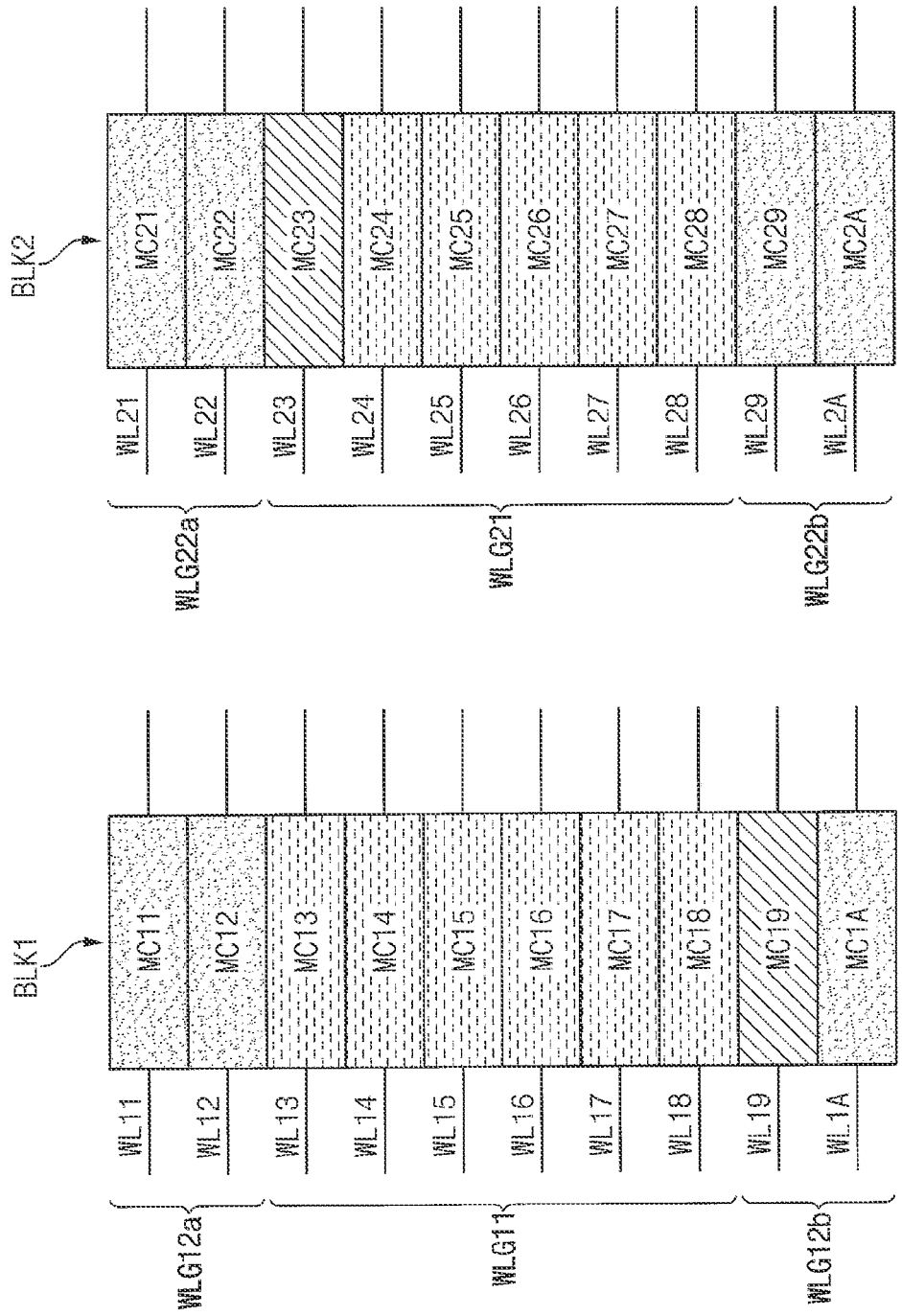
Figure 10G:
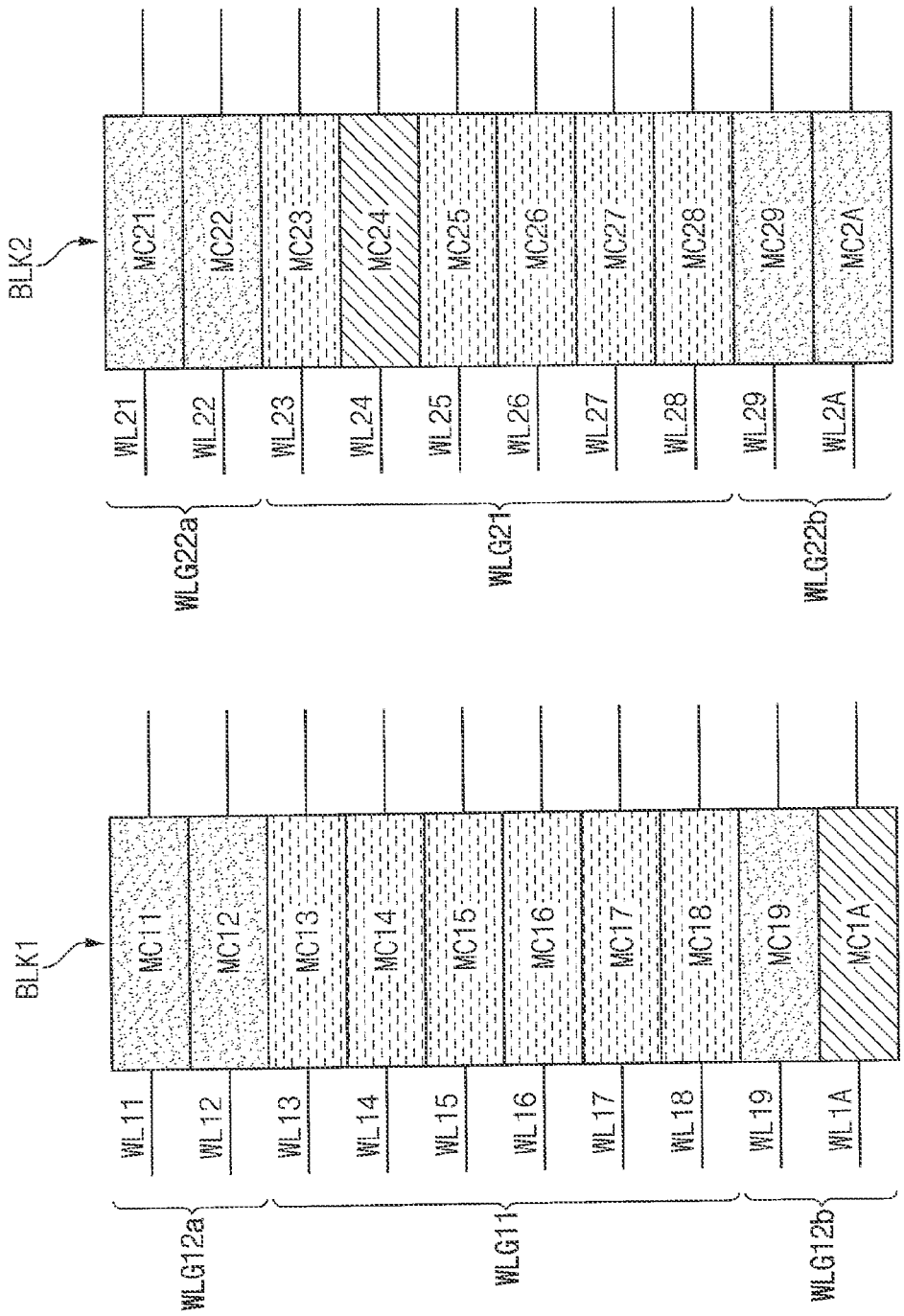

In addition, during the second write time interval TW2, fourth addresses A19 and A1A for fourth selected wordlines WL19 and WL1A included in the second wordline group WLG12b and fifth addresses A23 and A24 for fifth selected wordlines WL23 and WL24 included in the third wordline group WLG21 are received (step S430), and a data write operation is performed on the fourth and fifth selected wordlines WL19, WL1A, WL23 and WL24 based on the fourth and fifth addresses A19, A1A, A23 and A24 (step S440). For example, as illustrated in FIG. 10F, the data write operation may be performed on the wordlines WL19 and WL23 and the memory cells MC19 and MC23 during one unit interval. Subsequently, as illustrated in FIG. 10G, the data write operation may be performed on the wordlines WL1A and WL24 and the memory cells MC1A and MC24 during one unit interval. For example, two additional addresses of the first memory block BLK1 in a wordline group of the second characteristic are received and two additional addresses of the second memory block BLK2 of the first characteristic are received; a location of the first memory block BLK1 corresponding to a first one of the two additional addresses of the first memory block BLK1 is written and a location of the second memory block BLK2 corresponding to a first one of the two additional addresses of the second memory block BLK2 is written during a third time of the second write time interval TW2 after the second time; and a location of the first memory block BLK1 corresponding to a second address of the two additional addresses of the first memory block BLK1 is written and a location of the second memory block BLK2 corresponding to a second address of the two additional addresses of the second memory block BLK2 is written during a fourth time of the second write time interval TW2 after the third time.

In an example embodiment, during the second write time interval TW2, the first and second memory blocks BLK1 and BLK2 are alternately accessed. For example, the second and fourth addresses A17 to A1A for the first memory block BLK1 and the third and fifth addresses A21 to A24 for the second memory block BLK2 may be alternately received (e.g., in an order of A17, A21, A18, A22, A19, A23, A1A and A24).

Figure 10H:
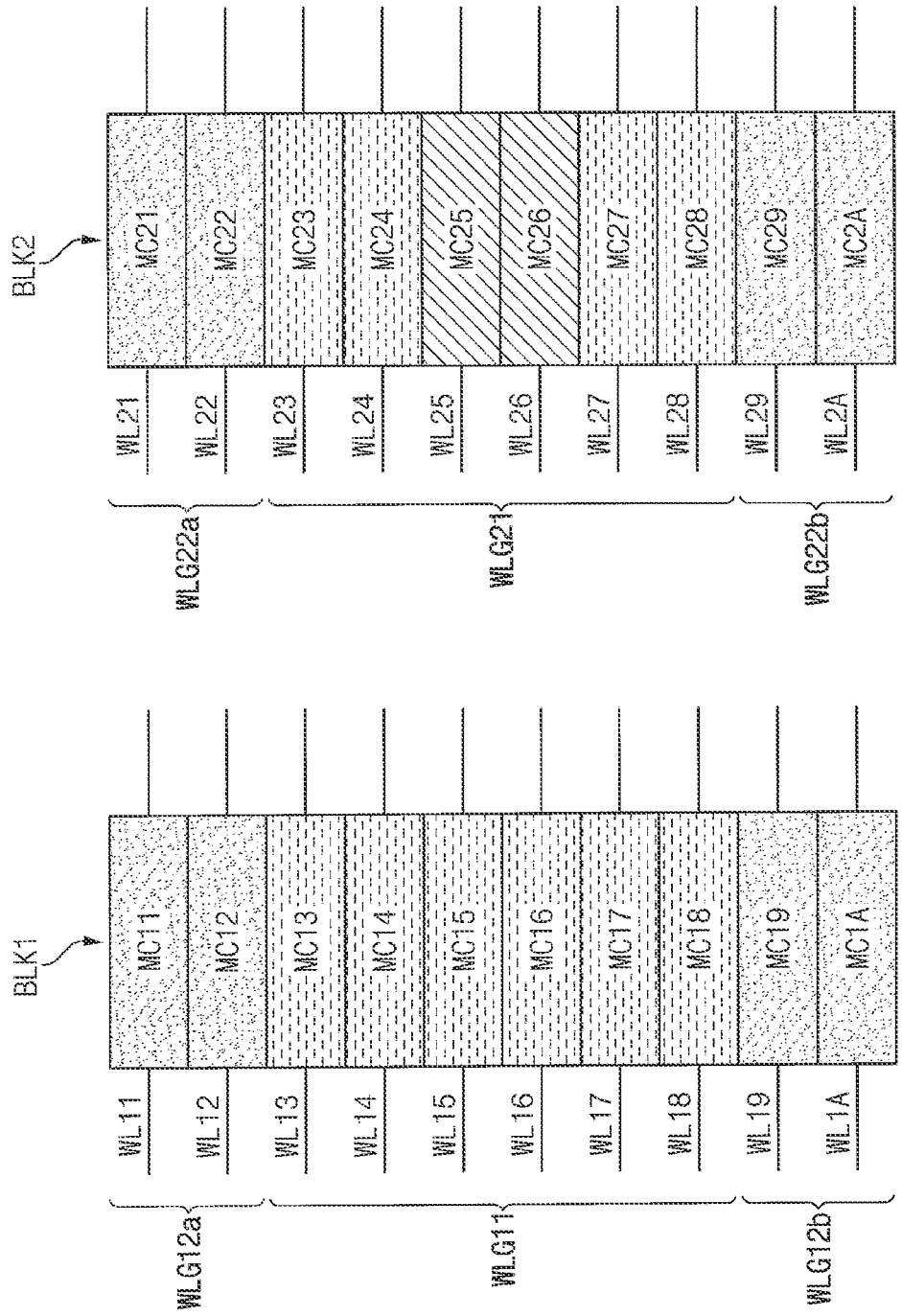
Figure 10I:
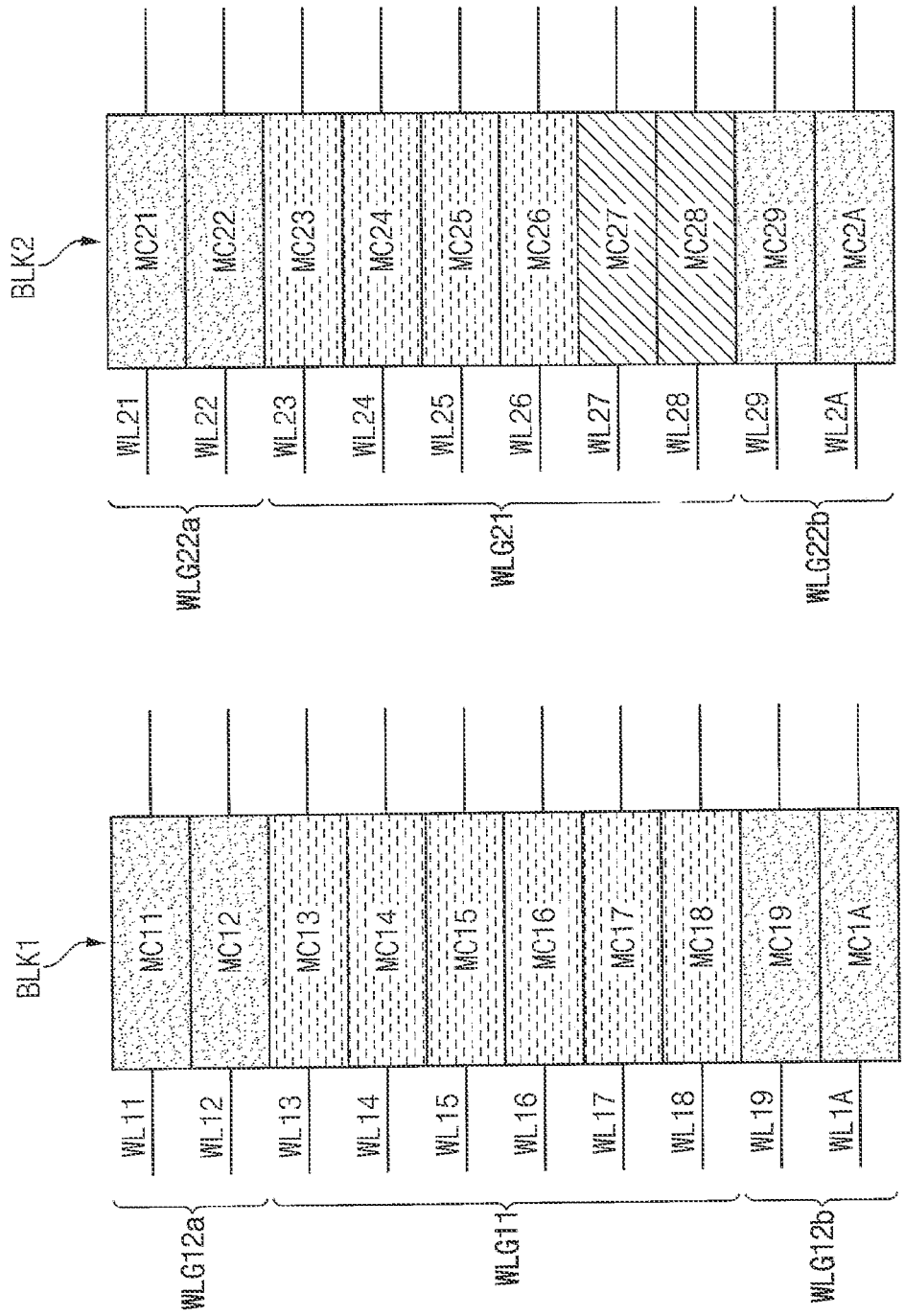

In step S300, during the third write time interval TW3, sixth addresses A25, A26, A27 and A28 for sixth selected wordlines WL25, WL26, WL27 and WL28 included in the third wordline group WLG21 are received (step S330), and a data write operation is performed on the sixth selected wordlines WL25 to WL28 based on the sixth addresses A25 to A28 (step S340). For example, as illustrated in FIG. 10H, the data write operation is performed on the wordlines WL25 and WL26 and the memory cells MC25 and MC26 during one unit interval. Subsequently, as illustrated in FIG. 10I, the data write operation may be performed on the wordlines WL27 and WL28 and the memory cells MC27 and MC28 during one unit interval. For example, four addresses of the second memory block BLK2 of a wordline group of the first characteristic are received; locations of the second memory block BLK2 corresponding to a first two of the four addresses are written during a first time of the third write time interval TW3; and locations of the second memory block BLK2 corresponding to a last two of the four addresses is written during a second time of the third write time interval TW3 after the first time.

Since each memory block is sequentially accessed from a first wordline to a last wordline, it may be difficult to apply the wordline mixing scheme to the second wordline group WLG12a that is accessed first in the first memory block BLK1 and the fourth wordline group WLG22b that is accessed last in the second memory block BLK2. Thus, as illustrated in FIG. 10A, in an initial operation time (e.g., in an early section of the first write time interval TW1), addresses A11 and A12 for the wordlines WL11 and WL12 included in the second wordline group WLG12a are received, and a data write operation is performed on the wordlines WL11 and WL12 and the memory cells MC11 and MC12 based on the addresses A11 and A12. Similarly, as illustrated in FIG. 10J, in a last operation time (e.g., in a later section of the third write time interval TW3), addresses A29 and A2A for the wordlines WL29 and WL2A included in the fourth wordline group WLG22b are received, and a data write operation are performed on the wordlines WL29 and WL2A and the memory cells MC29 and MC2A based on the addresses A29 and A2A.

Figure 11:
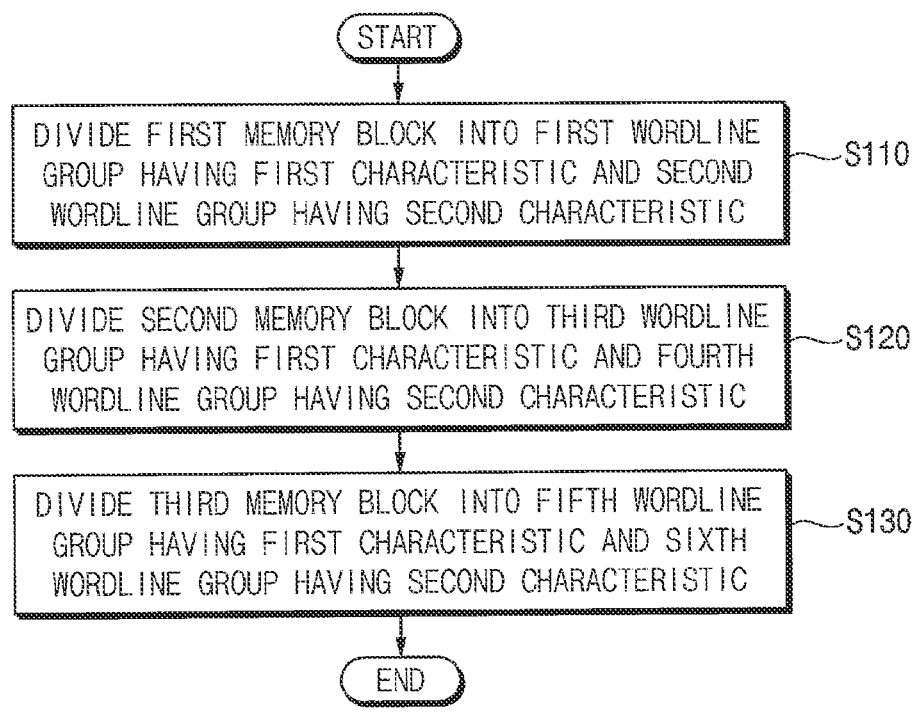
FIG. 11 is a flowchart illustrating another example of dividing each of a plurality of memory blocks into two or more wordline groups in FIG. 1.
Figure 12:
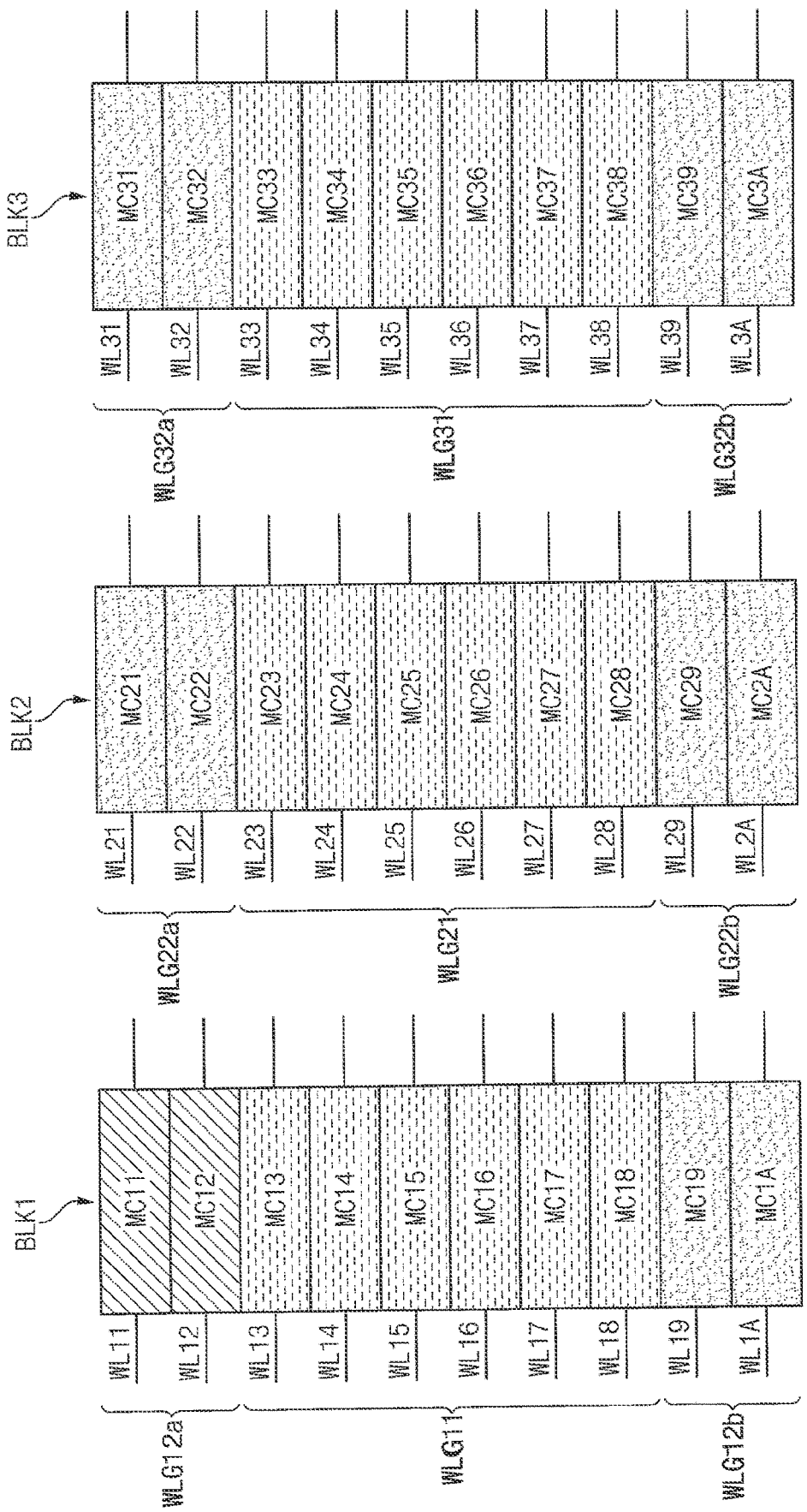
FIG. 12 is a diagram for describing an operation of FIG. 11.

FIG. 11 is a flowchart illustrating another example of dividing each of a plurality of memory blocks into two or more wordline groups in FIG. 1. FIG. 12 is a diagram for describing an operation of FIG. 11. The descriptions repeated with FIGS. 6 and 7 will be omitted.

Referring to FIGS. 1, 11 and 12, in step S100, steps S110 and S120 may be substantially the same as steps S110 and S120 in FIG. 6, respectively.

A third memory block BLK3 is divided into a fifth wordline group WLG31 having the first characteristic and a sixth wordline group WLG32a and WLG32b having the second characteristic (step S130). For example, in the third memory block BLK3, wordlines WL33, WL34, WL35, WL36, WL37 and WL38 and memory cells MC33, MC34, MC35, MC36, MC37 and MC38 connected thereto may be set as the fifth wordline group WLG31. In addition, in the third memory block BLK3, wordlines WL31, WL32, WL39 and WL3A and memory cells MC31, MC32, MC39 and MC3A connected thereto may be set as the sixth wordline group WLG32a and WLG32b.

Figure 13:
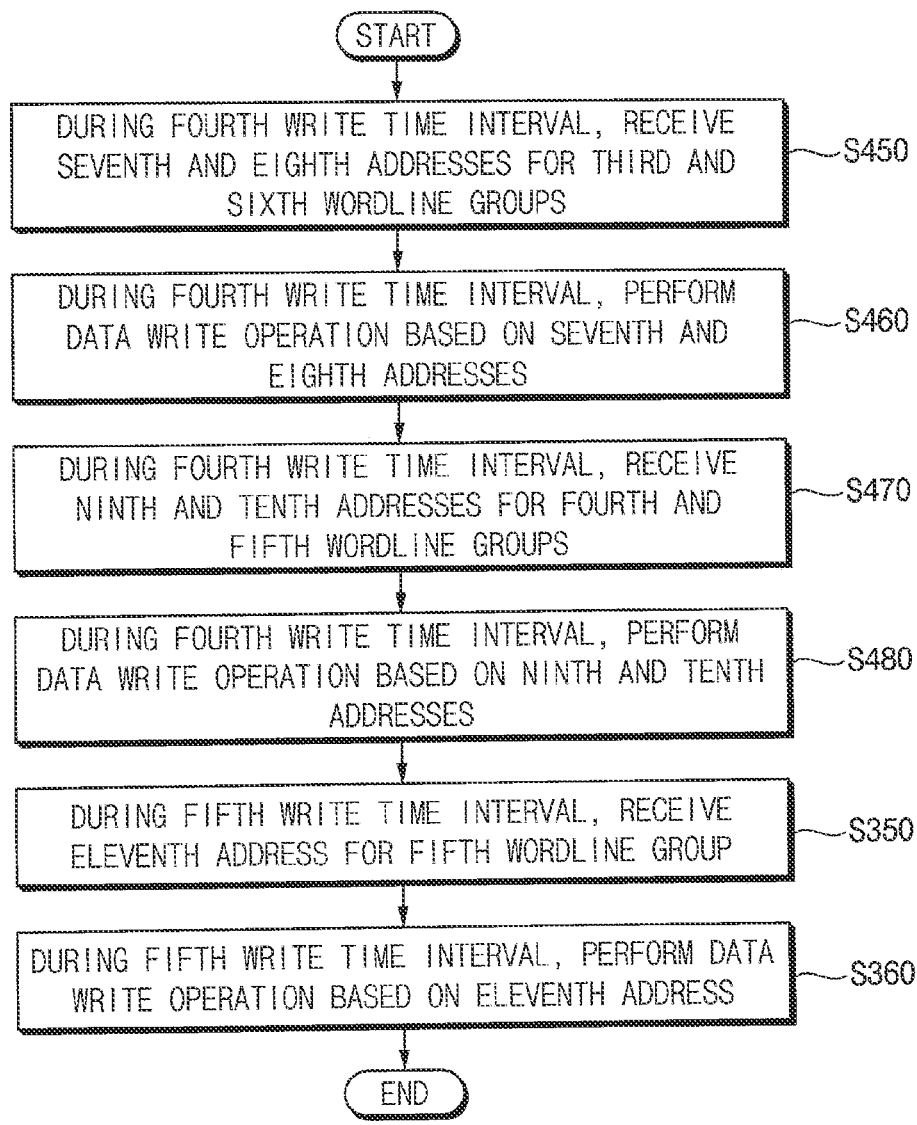
FIG. 13 is a flowchart illustrating an example of performing a data write operation on a wordline group included in one memory block and performing a data write operation on wordline groups included in two or more memory blocks in FIG. 1.
Figure 14:
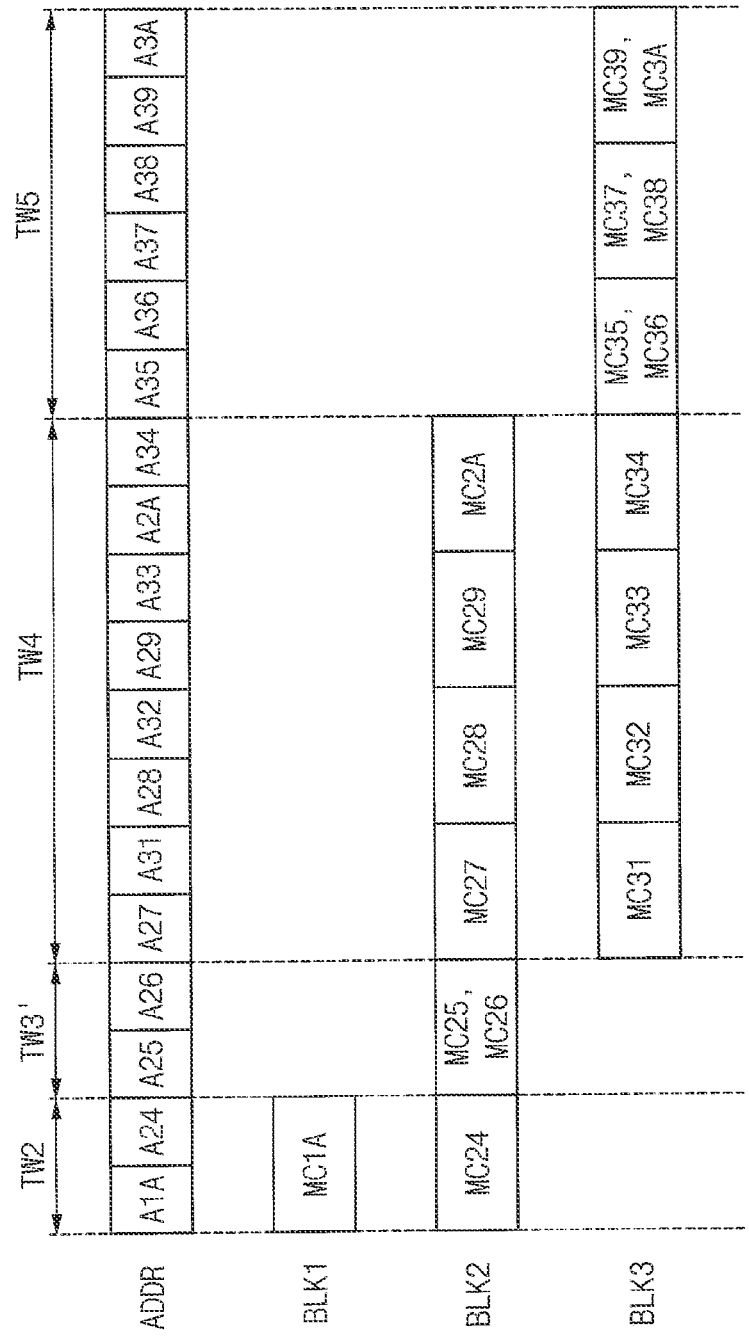

FIG. 13 is a flowchart illustrating an example of performing a data write operation on a wordline group included in one memory block and performing a data write operation on wordline groups included in two or more memory blocks in FIG. 1. FIGS. 14, 15A, 15B, 15C, 15D, 15E, 15F and 15G are diagrams for describing an operation of FIG. 13. The descriptions repeated with FIGS. 8, 9, 10A, 10B, 10C, 10D, 10E, 10F, 10G, 10H, 10I and 10J will be omitted.

Referring to FIGS. 13, 14, 15A, 15B, 15C, 15D, 15E, 15F and 15G, in steps S300 and S400, the entire write time interval for the first, second and third memory blocks BLK1 to BLK3 includes a first write time interval TW1, a second write time interval TW2, a third write time interval TW3', a fourth write time interval TW4 and a fifth write time interval TW5.

Operations in the first, second and third write time intervals TW1 to TW3' may be substantially the same as those described with reference to FIGS. 8, 9 and 10A to 10H. For convenience of illustration, all or a part of the first and second write time intervals TW1 and TW2 are omitted in FIG. 14.

Figure 15A:
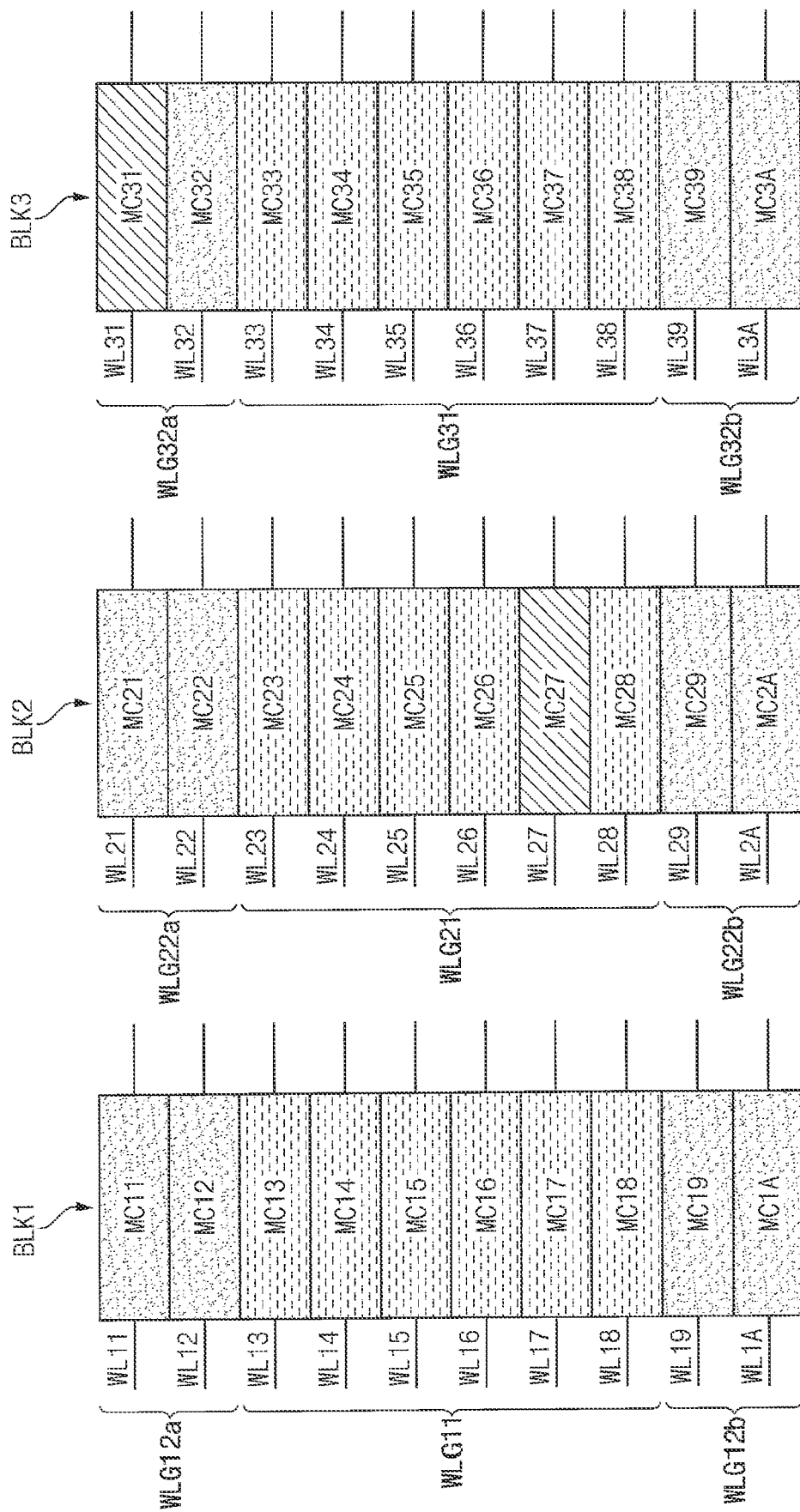
Figure 15B:
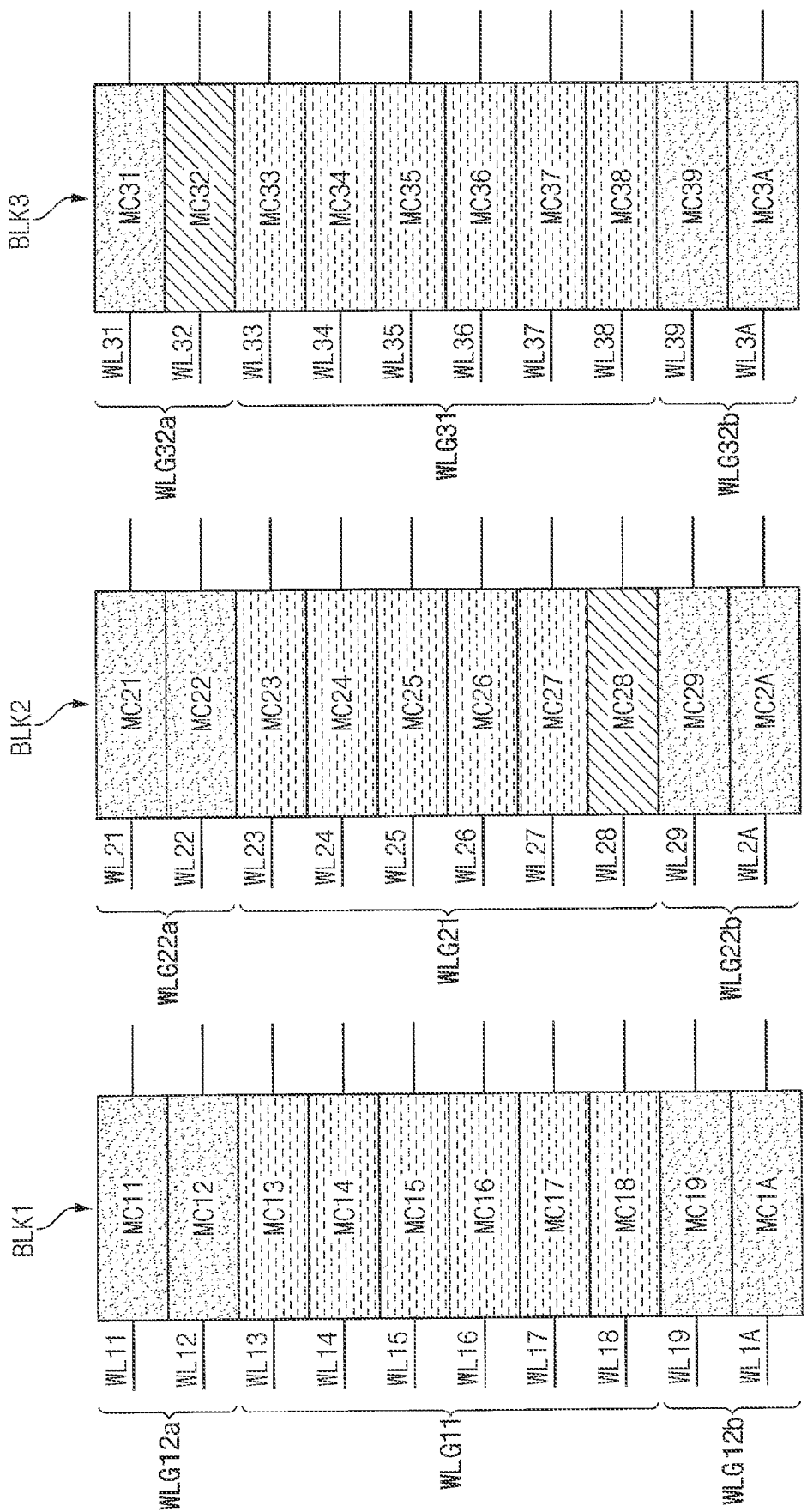

In step S400, during the fourth write time interval TW4, seventh addresses A27 and A28 for the seventh selected wordlines WL27 and WL28 included in the third wordline group WLG21 and eighth addresses A31 and A32 for the eighth selected wordlines WL31 and WL32 included in the sixth wordline group WLG32a are received (step S450), and a data write operation is performed on the seventh and eighth selected wordlines WL27, WL28, WL31 and WL32 based on the seventh and eighth addresses A27, A28, A31 and A32 (step S460). For example, as illustrated in FIG. 15A, the data write operation is performed on the wordlines WL27 and WL31 and the memory cells MC27 and MC31 during one unit interval. Subsequently, as illustrated in FIG. 15B, the data write operation is performed on the wordlines WL28 and WL32 and the memory cells MC28 and MC32 during one unit interval.

Figure 15C:
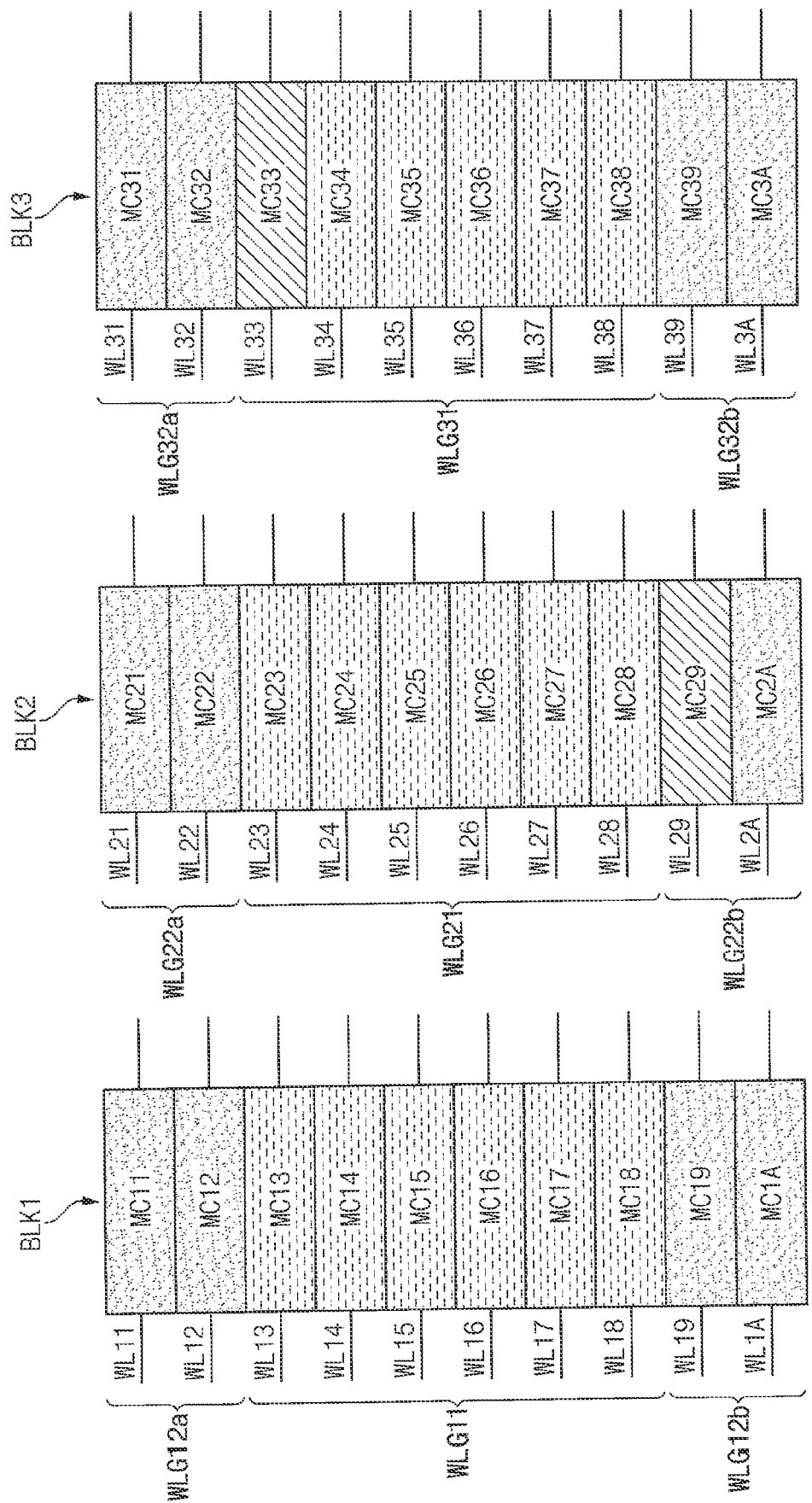
Figure 15D:
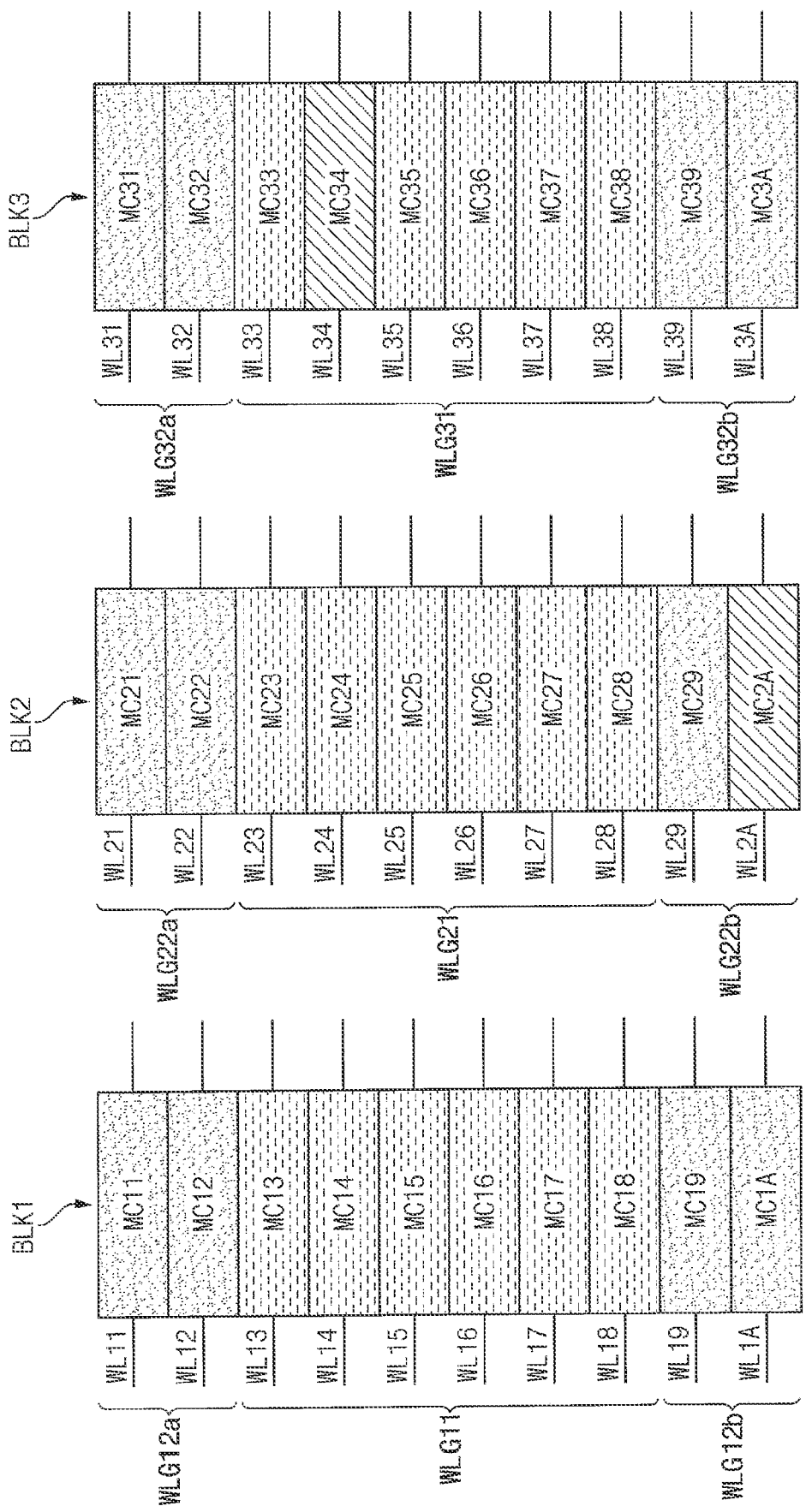

In addition, during the fourth write time interval TW4, ninth addresses A29 and A2A for the ninth selected wordlines WL29 and WL2A included in the fourth wordline group WLG22b and tenth addresses A33 and A34 for tenth selected wordlines WL33 and WL34 included in the fifth wordline group WLG31 are received (step S470), and a data write operation is performed on the ninth and tenth selected wordlines WL29, WL2A, WL33 and WL34 based on the ninth and tenth addresses A29, A2A, A33 and A34 (step S480). For example, as illustrated in FIG. 15C, the data write operation is performed on the wordlines WL29 and WL33 and the memory cells MC29 and MC33 during one unit interval. Subsequently, as illustrated in FIG. 15D, the data write operation is performed on the wordlines WL2A and WL34 and the memory cells MC2A and MC34 during one unit interval.

In an example embodiment, during the fourth write time interval TW4, the second and third memory blocks BLK2 and BLK3 are alternately accessed.

Figure 15E:
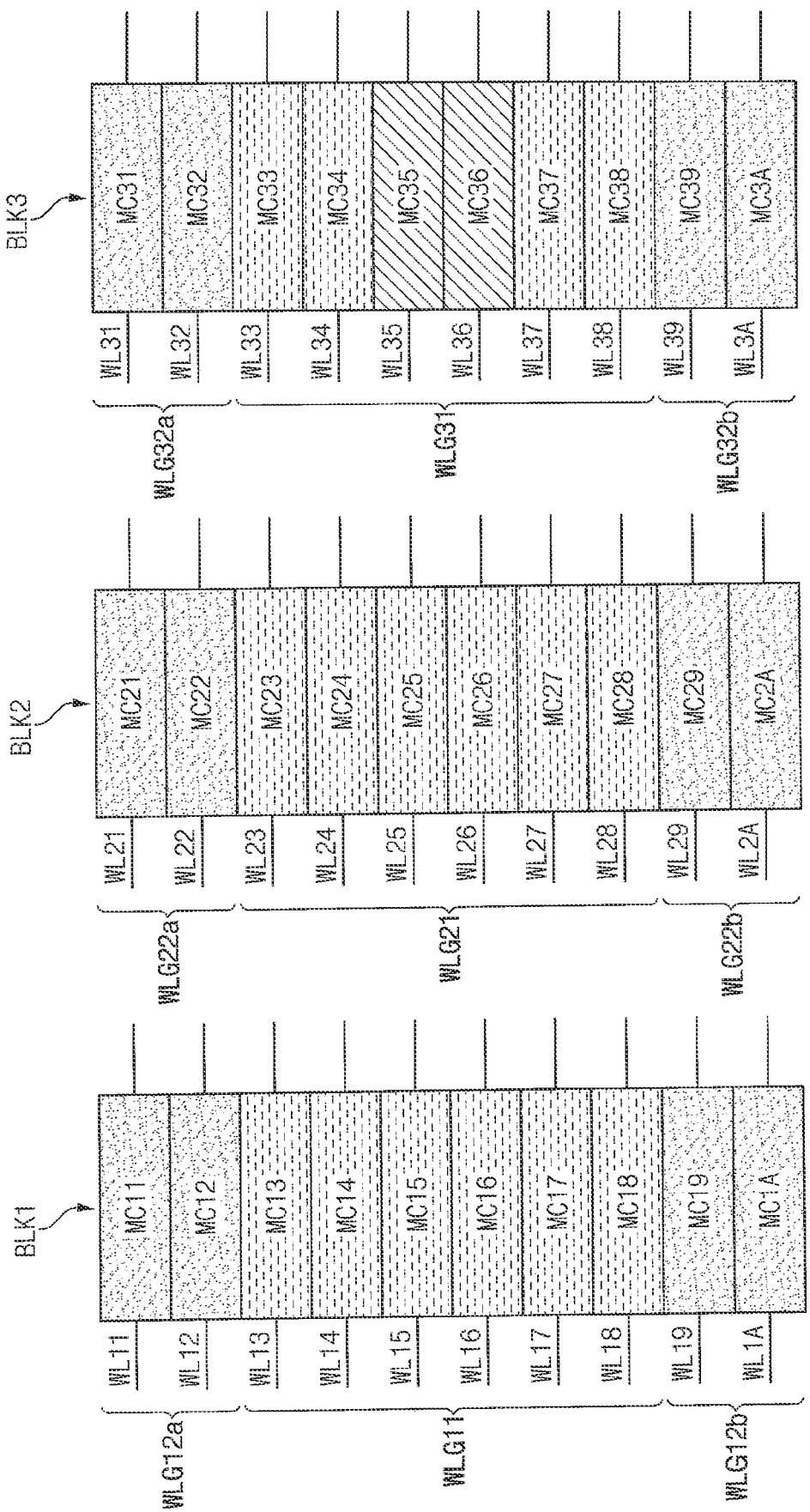
Figure 15F:
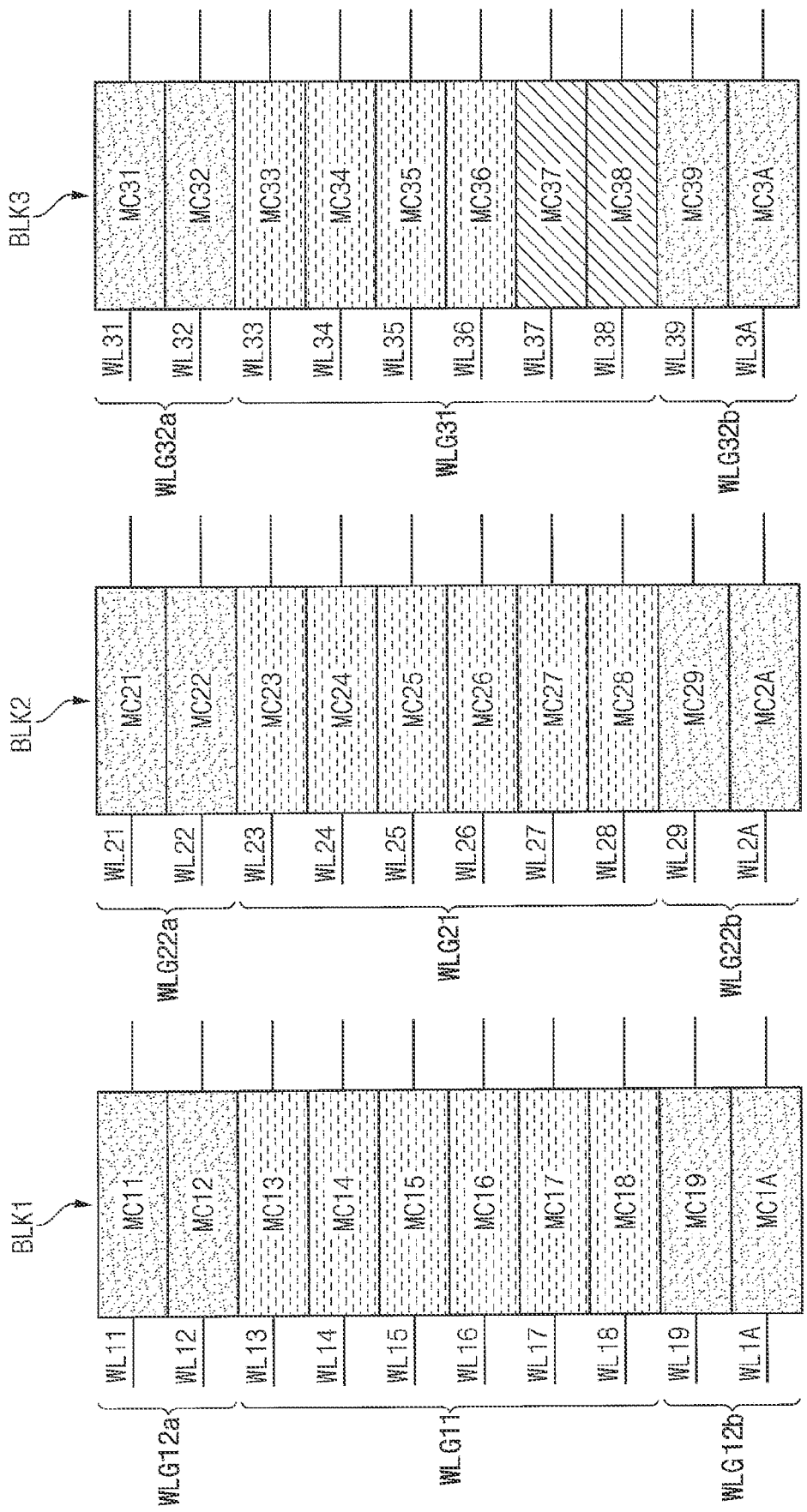

In step S300, during the fifth write time interval TW5, eleventh addresses A35, A36, A37 and A38 for eleventh selected wordlines WL35, WL36, WL37 and WL38 included in the fifth wordline group WLG31 are received (step S350), and a data write operation is performed on the eleventh selected wordlines WL35 to WL38 based on the eleventh addresses A35 to A38 (step S360). For example, as illustrated in FIG. 15E, the data write operation is performed on the wordlines WL35 and WL36 and the memory cells MC35 and MC36 during one unit interval. Subsequently, as illustrated in FIG. 15F, the data write operation is performed on the wordlines WL37 and WL38 and the memory cells MC37 and MC38 during one unit interval.

As illustrated in FIG. 15G, in a last operation time, addresses A39 and A3A for the wordlines WL39 and WL3A included in the sixth wordline group WLG32b are received, and a data write operation is performed on the wordlines WL39 and WL3A and the memory cells MC39 and MC3A based on the addresses A39 and A3A.

Figure 16:
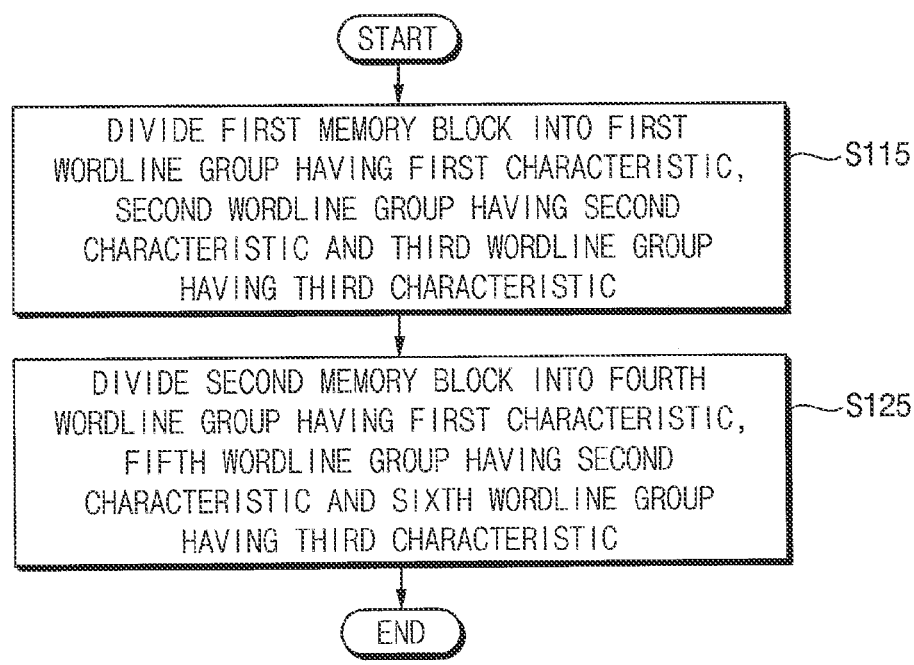
FIG. 16 is a flowchart illustrating an example of dividing each of a plurality of memory blocks into two or more wordline groups in FIG. 1.
Figure 17:
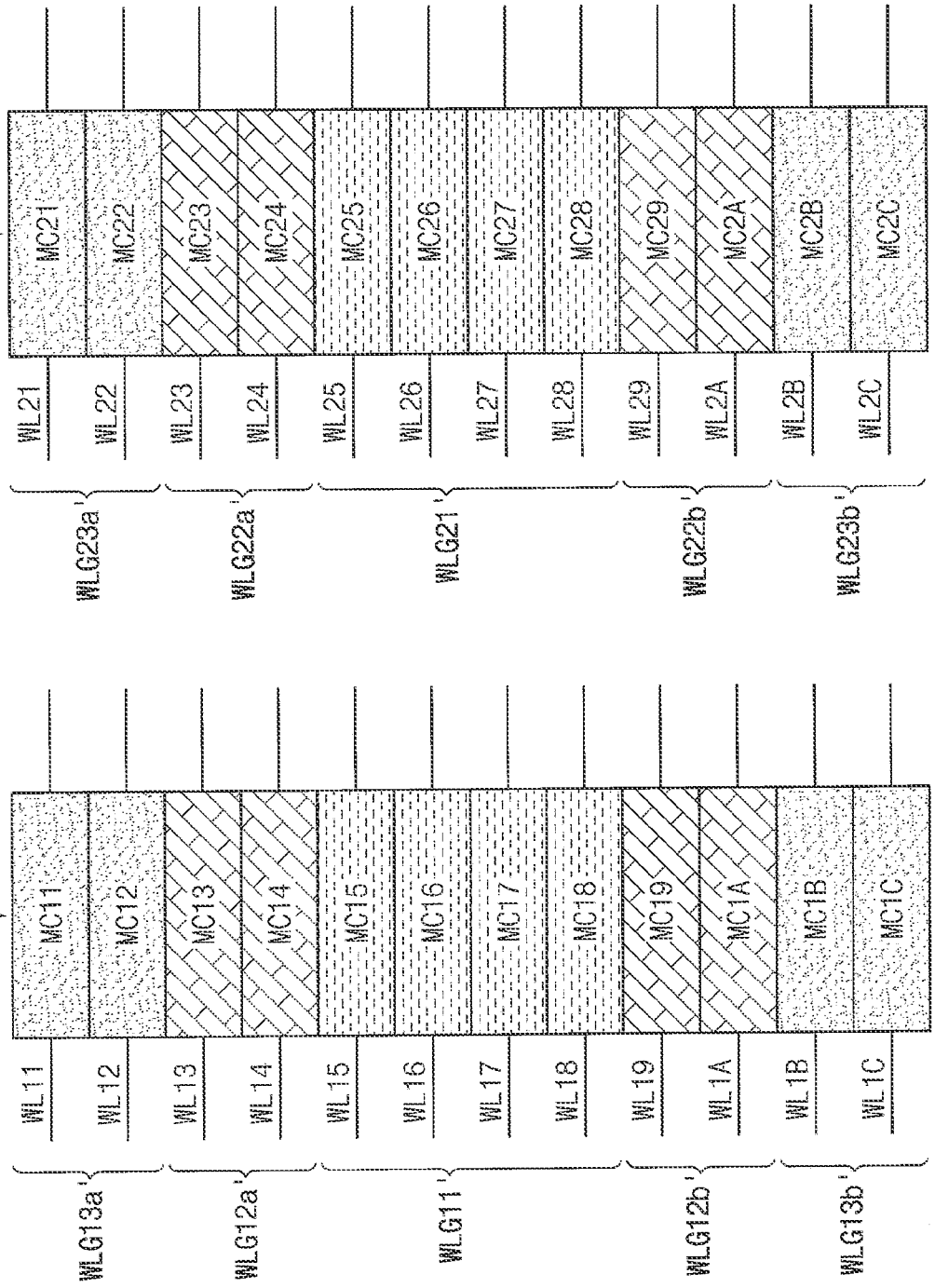
FIG. 17 is a diagram for describing an operation of FIG. 16.

FIG. 16 is a flowchart illustrating an example of dividing each of a plurality of memory blocks into two or more wordline groups in FIG. 1. FIG. 17 is a diagram for describing an operation of FIG. 16. The descriptions repeated with FIGS. 6 and 7 will be omitted.

Referring to FIGS. 1, 16 and 17, in step S100, a first memory block BLK1' is divided into a first wordline group WLG11' having a first characteristic, a second wordline group WLG12a' and WLG12b' having a second characteristic and a third wordline group WLG13a' and WLG13b' having a third characteristic (step S115). For example, in the first memory block BLK1', the wordlines WL15 to WL18 and the memory cells MC15 to MC18 may be set as the first wordline group WLG11', the wordlines WL13, WL14, WL19 and WL1A and the memory cells MC13, MC14, MC19 and MC1A may be set as the second wordline groups WLG12a' and WLG12b', and the wordlines WL11, WL12, WL1B and WL1C and the memory cells MC11, MC12, MC1B and MC1C may be set as the third wordline groups WLG13a' and WLG13b'.

In addition, a second memory block BLK2' is divided into a fourth wordline group WLG21' having the first characteristic, a fifth wordline group WLG22a' and WLG22b' having the second characteristic and a sixth wordline group WLG23a' and WLG23b' having the third characteristic (step S125). For example, in the second memory block BLK2', the wordlines WL25 to WL28 and the memory cells MC25 to MC28 may be set as the fourth wordline group WLG21', the wordlines WL23, WL24, WL29 and WL2A and the memory cells MC23, MC24, MC29 and MC2A may be set as the fifth wordline group WLG22a' and WLG22b', and the wordlines WL21, WL22, WL2B and WL2C and the memory cells MC21, MC22, MC2B and MC2C may be set as the sixth wordline group WLG23a' and WLG23b'.

The wordline mixing scheme according to example embodiments may be applied to the memory blocks BLK1' and BLK2' of FIG. 17 in various ways.

Although example embodiments are described based on two or three memory blocks and/or two or three wordline groups in each memory block, the inventive concept is not limited thereto. For example, the number of memory blocks and/or the number of wordline groups may be variously changed according to example embodiments. In addition, although example embodiments are described based on the examples where a configuration of the memory blocks (e.g., a configuration of the wordline groups) are all the same as each other, the inventive concept is not limited thereto. For example, wordline groups that have the same characteristics and are included in different memory blocks may include different numbers of wordlines.

Figure 18:
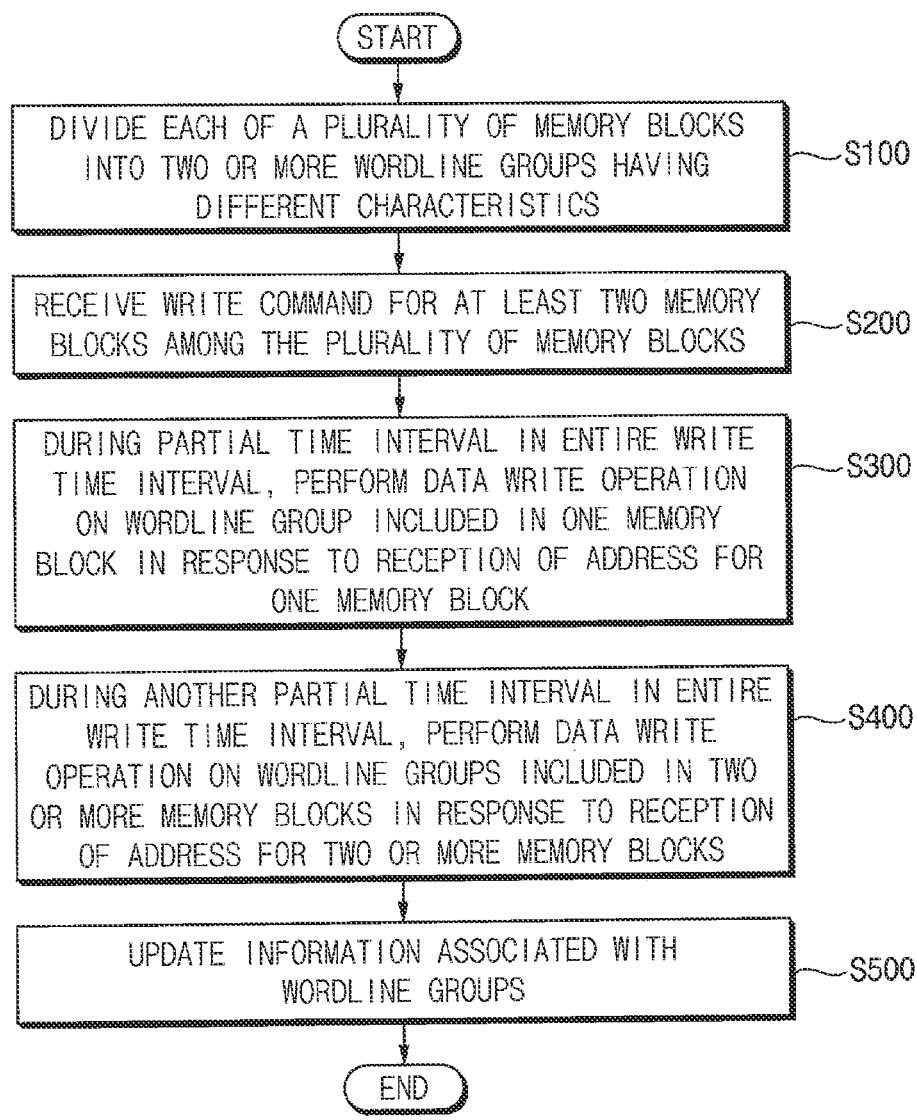
FIG. 18 is a flowchart illustrating a method of writing data in a nonvolatile memory device according to an example embodiment of the inventive concept.

FIG. 18 is a flowchart illustrating a method of writing data in a nonvolatile memory device according to an example embodiment of the inventive concept. The descriptions repeated with FIG. 1 will be omitted.

Referring to FIG. 18, in a method of writing data in a nonvolatile memory device according to an example embodiment, steps S100, S200, S300 and S400 may be substantially the same as steps S100, S200, S300 and S400 in FIG. 1, respectively.

Information associated with the at least two wordline groups included in each of the plurality of memory blocks are updated (step S500). For example, a look-up table (e.g., the look-up table 570 in FIG. 3) including the information (e.g., the wordline group information) may be updated in real time or during runtime while the nonvolatile memory device is being driven.

Figure 19:
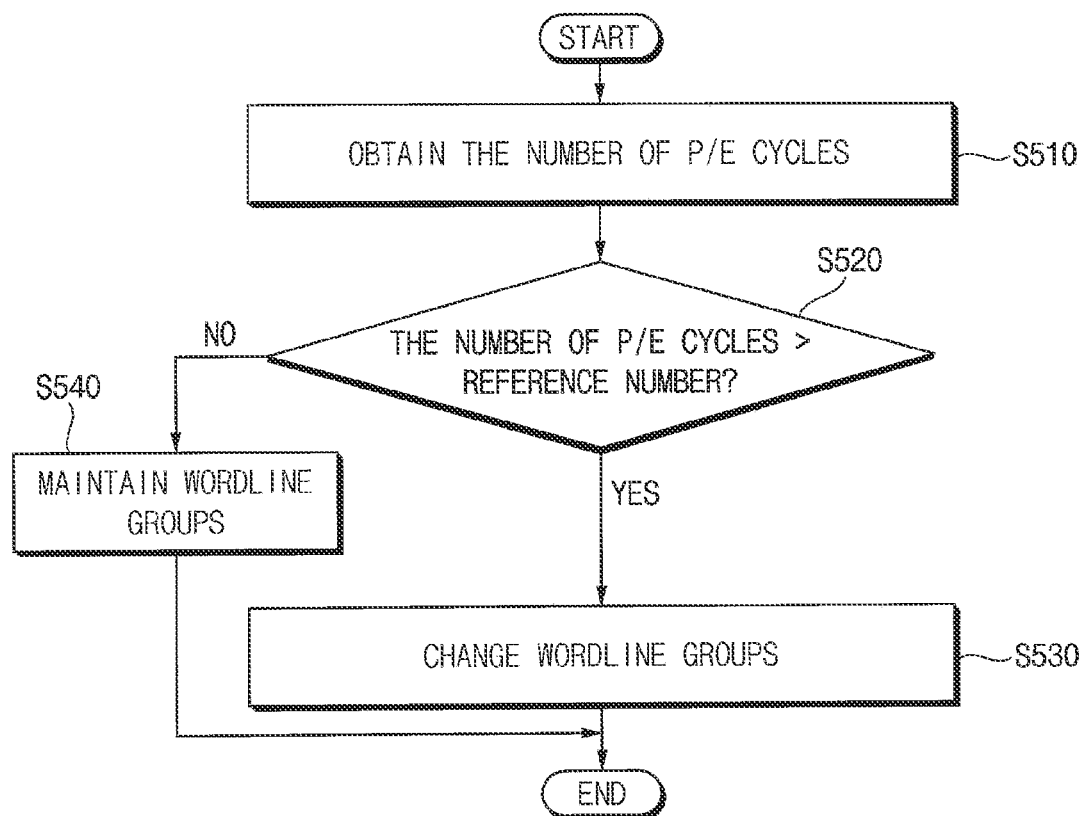
FIG. 19 is a flowchart illustrating an example of updating information associated with at least two wordline groups included in each of a plurality of memory blocks in FIG. 18.

FIG. 19 is a flowchart illustrating an example of updating information associated with at least two wordline groups included in each of a plurality of memory blocks in FIG. 18. The information may identify for each memory block to which wordline group the corresponding memory block belongs (e.g., a wordline group of a first characteristic or a second characteristic).

Referring to FIGS. 18 and 19, in step S500, the number of program/erase (P/E) cycles is obtained for each memory block (step S510), and the number of P/E cycles is compared with a reference number (step S520).

When the number of P/E cycles is greater than the reference number (step S520: YES), a configuration of the two or more wordline groups included in the corresponding memory block is changed (step S530). For example, if a portion of a memory block used to belong to a first wordline group having a relatively good characteristics (e.g., a first characteristic) and the P/E cycles of the portion exceeds the reference number, the portion or its wordlines could be moved to a second wordline group having a second other characteristic. When the number of P/E cycles is less than or equal to the reference number (step S520: NO), the configuration of the two or more wordline groups included in the corresponding memory block is maintained (step S540). For example, the above-described operation may be repeated periodically and/or every predetermined number of P/E cycles.

As will be appreciated by those of ordinary skill in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

FIG. 20 is a block diagram illustrating a storage device and a storage system including the storage device according to an example embodiment of the inventive concept.

Referring to FIG. 20, a storage system 1000 includes a host device 1100 and a storage device 1200.

The host device 1100 controls overall operations of the storage system 1000. Although not illustrated in FIG. 20, the host device 1100 may include a host processor and a host memory. The host processor may control an operation of the host device 1100. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 1200 at the operating system level.

The storage device 1200 is accessed by the host device 1100. The storage device 1200 includes a storage controller 1210 (e.g., a control circuit), a plurality of nonvolatile memories (NVMs) 1220a, 1220b and 1220c, and a buffer memory 1230.

The storage controller 1210 may control an operation of the storage device 1200 and/or operations of the plurality of nonvolatile memories 1220a, 1220b and 1220c based on a command and data that are received from the host device 1100. The plurality of nonvolatile memories 1220a, 1220b and 1220c may store a plurality of data. For example, the plurality of nonvolatile memories 1220a, 1220b and 1220c may store meta data or various user data. The buffer memory 1230 may store instructions and/or data that are executed and/or processed by the storage controller 1210, and may temporarily store data stored in or to be stored into the plurality of nonvolatile memories 1220a, 1220b and 1220c. The memory system 10 of FIG. 2 and/or the memory system 20 of FIG. 5 may be implemented in the form of the storage device 1200. For example, the storage controller 1210 may correspond to the memory controller 200 in FIG. 2 and/or the memory controller 400 in FIG. 5, and the nonvolatile memories 1220a, 1220b and 1220c may correspond to the memory device 100 in FIG. 2 and/or the memory device 300 in FIG. 5.

In some example embodiments, the storage device 1200 may be a solid state drive (SSD), a universal flash storage (UFS), a multi-media card (MMC) or an embedded multimedia card (eMMC). In other example embodiments, the storage device 1200 may be one of a secure digital (SD) card, a micro SD card, a memory stick, a chip card, a universal serial bus (USB) card, a smart card, or a compact flash (CF) card.

Figure 21:
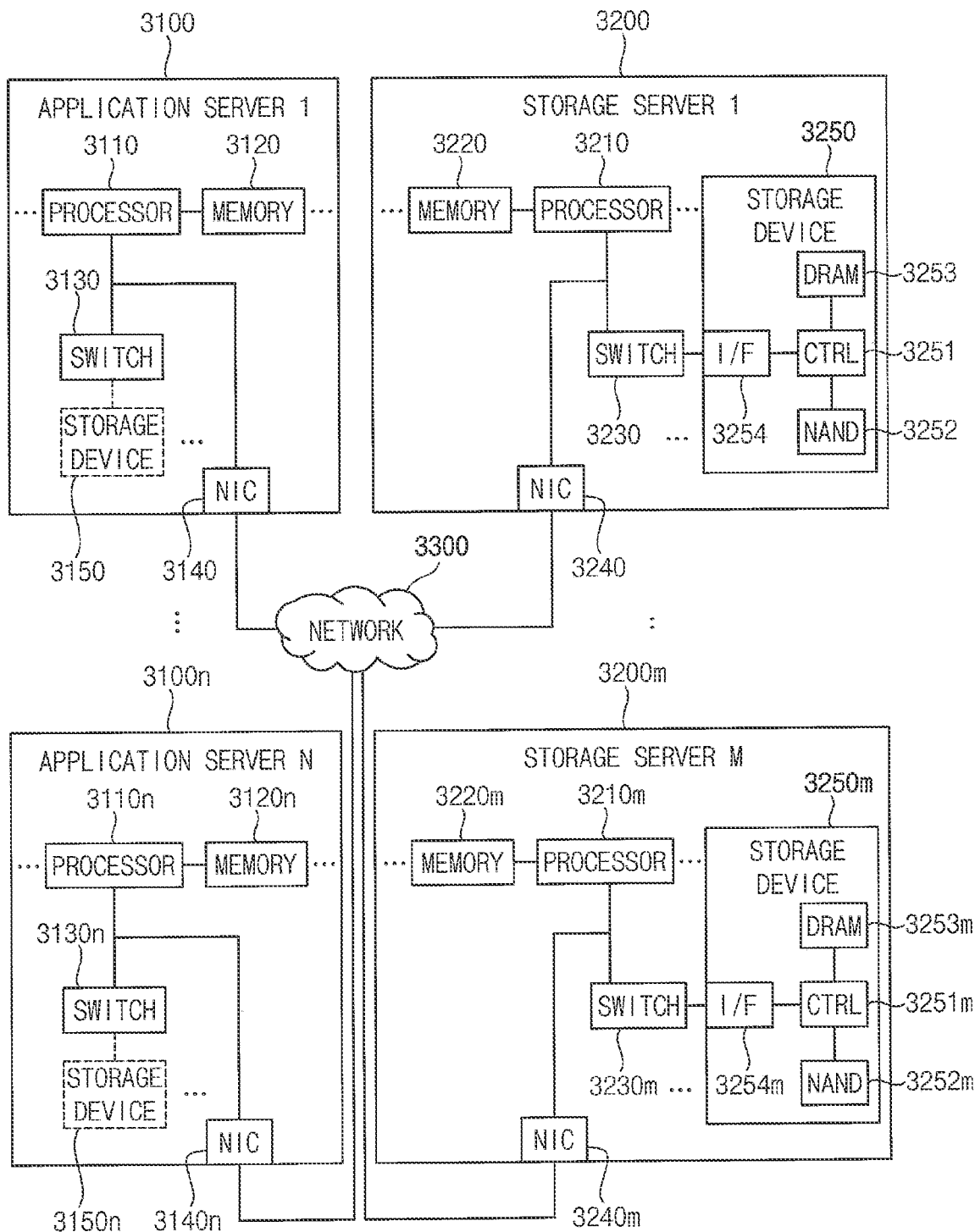
FIG. 21 is a block diagram illustrating a data center including a storage system according to an example embodiment of the inventive concept.

FIG. 21 is a block diagram illustrating a data center including a storage system according to an example embodiment of the inventive concept.

Referring to FIG. 21, a data center 3000 may be a facility that collects various types of data and provides various services, and may be referred to as a data storage center. The data center 3000 may be a system for operating search engines and databases, and may be a computing system used by companies such as banks or government agencies. The data center 3000 may include application servers 3100 to 3100n and storage servers 3200 to 3200m. The number of the application servers 3100 to 3100n and the number of the storage servers 3200 to 3200m may be variously selected according to example embodiments, and the number of the application servers 3100 to 3100n and the number of the storage servers 3200 to 3200m may be different from each other.

The application server 3100 may include at least one processor 3110 and at least one memory 3120, and the storage server 3200 may include at least one processor 3210 and at least one memory 3220. An operation of the storage server 3200 will be described as an example. The processor 3210 may control overall operations of the storage server 3200, and may access the memory 3220 to execute instructions and/or data loaded in the memory 3220. The memory 3220 may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors 3210 and the number of the memories 3220 included in the storage server 3200 may be variously selected according to example embodiments. In some example embodiments, the processor 3210 and the memory 3220 may provide a processor-memory pair. In some example embodiments, the number of the processors 3210 and the number of the memories 3220 may be different from each other. The processor 3210 may include a single core processor or a multiple core processor. The above description of the storage server 3200 may be similarly applied to the application server 3100. The application server 3100 may include at least one storage device 3150, and the storage server 3200 may include at least one storage device 3250. In some example embodiments, the application server 3100 does not include the storage device 3150. The number of the storage devices 3250 included in the storage server 3200 may be variously selected according to example embodiments.

The application servers 3100 to 3100n and the storage servers 3200 to 3200m may communicate with each other through a network 3300. The network 3300 may be implemented using a fiber channel (FC) or an Ethernet. The FC may be a medium used for a relatively high speed data transmission, and an optical switch that provides high performance and/or high availability may be used. The storage servers 3200 to 3200m may be provided as file storages, block storages or object storages according to an access scheme of the network 3300.

In some example embodiments, the network 3300 may be a storage-only network or a network dedicated to a storage such as a storage area network (SAN). For example, the SAN may be an FC-SAN that uses an FC network and is implemented according to an FC protocol (FCP). In another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network 3300 may be a general or normal network such as the TCP/IP network. For example, the network 3300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server 3100 and the storage server 3200. The description of the application server 3100 may be applied to the other application server 3100n, and the description of the storage server 3200 may be applied to the other storage server 3200m.

The application server 3100 may store data requested to be stored by a user or a client into one of the storage servers 3200 to 3200m through the network 3300. In addition, the application server 3100 may obtain data requested to be read by the user or the client from one of the storage servers 3200 to 3200m through the network 3300. For example, the application server 3100 may be implemented as a web server or a database management system (DBMS).

The application server 3100 may access a memory 3120n or a storage device 3150n included in the other application server 3100n through the network 3300, and/or may access the memories 3220 to 3220m or the storage devices 3250 to 3250m included in the storage servers 3200 to 3200m through the network 3300. Thus, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. The data may be transferred from the storage devices 3250 to 3250m of the storage servers 3200 to 3200m to the memories 3120 to 3120n of the application servers 3100 to 3100n directly or through the memories 3220 to 3220m of the storage servers 3200 to 3200m. For example, the data transferred through the network 3300 may be encrypted data for security or privacy.

In the storage server 3200, an interface 3254 may provide a physical connection between the processor 3210 and a controller 3251 and/or a physical connection between a network interface card (NIC) 3240 and the controller 3251. For example, the interface 3254 may be implemented based on a direct attached storage (DAS) scheme in which the storage device 3250 is directly connected with a dedicated cable. For example, the interface 3254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200 may further include a switch 3230 and the NIC 3240. The switch 3230 may selectively connect the processor 3210 with the storage device 3250 or may selectively connect the NIC 3240 with the storage device 3250 under a control of the processor 3210. Similarly, the application server 3100 may further include a switch 3130 and an MC 3140.

In some example embodiments, the NIC 3240 may include a network interface card, a network adapter, or the like. The NIC 3240 may be connected to the network 3300 through a wired interface, a wireless interface, a Bluetooth interface, or an optical interface. The NIC 3240 may further include an internal memory, a digital signal processor (DSP), a host bus interface, or the like, and may be connected to the processor 3210 and/or the switch 3230 through the host bus interface. The host bus interface may be implemented as one of the above-described examples of the interface 3254. In some example embodiments, the NIC 3240 may be integrated with at least one of the processor 3210, the switch 3230 and the storage device 3250.

In the storage servers 3200 to 3200m and/or the application servers 3100 to 3100n, the processor may transmit a command to the storage devices 3150 to 3150n and 3250 to 3250m or the memories 3120 to 3120n and 3220 to 3220m to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 3150 to 3150m and 3250 to 3250m may transmit a control signal and command/address signals to NAND flash memory devices 3252 to 3252m in response to a read command received from the processor. When data is read from the NAND flash memory devices 3252 to 3252m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251 may control overall operations of the storage device 3250. In some example embodiments, the controller 3251 may include a static random access memory (SRAM). The controller 3251 may write data into the NAND flash memory device 3252 in response to a write command, or may read data from the NAND flash memory device 3252 in response to a read command. For example, the write command and/or the read command may be provided from the processor 3210 in the storage server 3200, the processor 3210m in the other storage server 3200m, or the processors 3110 to 3110n in the application servers 3100 to 3100n. A DRAM 3253 may temporarily store (e.g., may buffer) data to be written to the NAND flash memory device 3252 or data read from the NAND flash memory device 3252. Further, the DRAM 3253 may store meta data. The meta data may be data generated by the controller 3251 to manage user data or the NAND flash memory device 3252.

The storage devices 3150 to 3150m and 3250 to 3250m may be implemented based on the nonvolatile memory device and the storage device according to example embodiments described with reference to FIGS. 1 through 20, and may be implemented to perform the method of writing data in the nonvolatile memory device according to example embodiments described with reference to FIGS. 1 through 20.

The inventive concept may be applied to various electronic devices and systems that include the nonvolatile memory devices and the storage devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those of ordinary skill in the art will readily appreciate that many modifications are possible in the example embodiments without materially departing from the example embodiments. Accordingly, all such modifications are intended to be included within the scope of the example embodiments.

What is claimed is:

1. A method of operating a memory system including a memory controller and a nonvolatile memory device including a plurality of memory blocks, the method comprising:
   obtaining wordline group information by dividing each of the plurality of memory blocks into two or more wordline groups having different characteristics;
   storing the wordline group information in the nonvolatile memory device;
   transmitting a write command for at least two memory blocks from the memory controller to the nonvolatile memory device;
   during a first partial time interval of an entire write time interval, performing a first data write operation on a wordline group included in only a first memory block based on the wordline group information and the write command; and
   during a second partial time interval of the entire write time interval, performing a second data write operation at least partially simultaneously on a wordline group included in the first memory block and a wordline group included in a second memory block based on the wordline group information and the write command.

2. The method of claim 1, further comprising: updating the wordline group information.

3. The method of claim 2, wherein updating the wordline group information comprises:
   obtaining a number of first program/erase (P/E) cycles for the first memory block; and
   when the number of the first P/E cycles is greater than a reference number, changing the two or more wordline groups included in the first memory block.

4. The method of claim 2, wherein the wordline group information is updated in real time while the nonvolatile memory device is driven.

5. The method of claim 4, wherein the wordline group information is updated by the memory controller.

6. The method of claim 1, wherein the wordline group information is obtained while the nonvolatile memory device is manufactured.

7. The method of claim 1, wherein the wordline group information is obtained by the memory controller.

8. The method of claim 1, wherein: the first memory block is divided into a first wordline group having a first characteristic and a second wordline group having a second characteristic, and the second memory block is divided into a third wordline group having the first characteristic and a fourth wordline group having the second characteristic.

9. The method of claim 8, wherein: the first and second characteristics are determined based on a program performance, the first and third wordline groups include wordlines having a program performance higher than a reference program performance, and the second and fourth wordline groups include wordlines having a program performance lower than or equal to the reference program performance.

10. The method of claim 8, wherein: the first and second characteristics are determined based on a data retention performance, the first and third wordline groups include wordlines having a data retention performance higher than a reference data retention performance, and the second and fourth wordline groups include wordlines having a data retention performance lower than or equal to the reference data retention performance.

11. The method of claim 8, wherein: the first and second characteristics are determined based on positions of wordlines in the first and second memory blocks, the second and fourth wordline groups include wordlines positioned adjacent to edges of the first and second memory blocks, and the first and third wordline groups include wordlines positioned adjacent to centers of the first and second memory blocks.

12. The method of claim 8, wherein a number of bits of data stored in memory cells included in the first wordline group is different from a number of bits of data stored in memory cells included in the second wordline group.

13. The method of claim 8, wherein performing the first data write operation on the wordline group included in only the first memory block comprises:
   during the first partial time interval, receiving a first address for first selected wordlines included in the first wordline group; and
   during the first partial time interval, performing the first data write operation on the first selected wordlines based on the first address.

14. The method of claim 13, wherein performing the second data write operation at least partially simultaneously on the wordline group included in the first memory block and the wordline group included in the second memory block comprises:
   during the second partial time interval, receiving a second address for second selected wordlines included in the first wordline group and a third address for third selected wordlines included in the fourth wordline group; and
   during the second partial time interval, performing the second data write operation on the second and third selected wordlines based on the second and third addresses.

15. The method of claim 1, wherein the second partial time interval is consecutively after the first partial time interval.

16. The method of claim 1, further comprising: during a third partial time interval of the entire write time interval, performing a third data write operation on a wordline group included in only the second memory block based on the wordline group information and the write command.

17. A memory system comprising:
   a memory controller; and
   a nonvolatile memory device including a plurality of memory blocks,
   wherein:
   wordline group information is obtained by dividing each of the plurality of memory blocks into two or more wordline groups having different characteristics, and is stored in the nonvolatile memory device;
   a write command for at least two memory blocks is transmitted from the memory controller to the nonvolatile memory device;
   during a first partial time interval of an entire write time interval, a first data write operation is performed on a wordline group included in only a first memory block based on the wordline group information and the write command; and
   during a second partial time interval of the entire write time interval, a second data write operation is performed at least partially simultaneously on a wordline group included in the first memory block and a wordline group included in a second memory block based on the wordline group information and the write command.

18. The memory system of claim 17, wherein the wordline group information is updated in real time while the nonvolatile memory device is driven.

19. The memory system of claim 18, wherein the memory controller is configured to update the wordline group information.

20. The memory system of claim 17, wherein the memory controller is configured to obtain the wordline group information.

* * * * *